US009935117B2

(12) United States Patent
Kim

(10) Patent No.: US 9,935,117 B2
(45) Date of Patent: Apr. 3, 2018

(54) SINGLE POLY NONVOLATILE MEMORY CELLS, ARRAYS THEREOF, AND METHODS OF OPERATING THE SAME

(71) Applicant: SK hynix Inc., Gyeonggi-do (KR)

(72) Inventor: Nam Yoon Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/205,999

(22) Filed: Jul. 8, 2016

(65) Prior Publication Data
US 2017/0229471 A1 Aug. 10, 2017

(30) Foreign Application Priority Data

Feb. 4, 2016 (KR) .................... 10-2016-0013854

(51) Int. Cl.
| H01L 27/115 | (2017.01) |
| G11C 16/04 | (2006.01) |
| H01L 27/11558 | (2017.01) |
| G11C 16/10 | (2006.01) |
| G11C 16/18 | (2006.01) |
| H01L 23/528 | (2006.01) |
| H01L 27/11524 | (2017.01) |
| H01L 27/11529 | (2017.01) |
| G11C 16/14 | (2006.01) |
| G11C 16/26 | (2006.01) |

(52) U.S. Cl.
CPC ...... H01L 27/11558 (2013.01); G11C 16/045 (2013.01); G11C 16/0408 (2013.01); G11C 16/10 (2013.01); G11C 16/14 (2013.01); G11C 16/18 (2013.01); H01L 23/528 (2013.01); H01L 27/11524 (2013.01); H01L 27/11529 (2013.01); G11C 16/26 (2013.01); *G11C 2216/10* (2013.01)

(58) Field of Classification Search
CPC ......... H01L 27/11558; H01L 27/11524; G11C 16/0408; G11C 16/0433
See application file for complete search history.

(56) References Cited

U.S. PATENT DOCUMENTS

2005/0030827 A1* 2/2005 Gilliland ............ G11C 16/3404
365/232
2013/0234227 A1 9/2013 Chen et al.

* cited by examiner

Primary Examiner — Allison P Bernstein
(74) Attorney, Agent, or Firm — IP & T Group LLP

(57) ABSTRACT

A single poly NVM cell includes a first N-type well region and a second N-type well region spaced apart from each other by a P-type semiconductor layer, a first active region and a second active region disposed in the first N-type well region and the second N-type well region, respectively, a P-channel floating gate transistor including a floating gate disposed in the first active region, a P-type drain region disposed in the first active region, and a P-type junction region disposed in the first active region, wherein the floating gate extends to over the second active region, a P-channel read selection transistor including a read selection gate electrode disposed in the first active region, the P-type junction region disposed in the first active region, and a P-type source region disposed in the first active region, and an interconnection line connecting the first N-type well region to the P-type source region of the P-channel read selection transistor.

7 Claims, 19 Drawing Sheets

SINGLE POLY NONVOLATILE MEMORY CELLS, ARRAYS THEREOF, AND METHODS OF OPERATING THE SAME

CROSS-REFERENCE TO RELATED APPLICATIONS

The present application claims priority under 35 U.S.C 119(a) to Korean Patent Application No. 10-2016-0013854, filed on Feb. 4, 2016, which is herein incorporated by references in its entirety.

BACKGROUND

1. Technical Field

Various embodiments of the present disclosure generally relate to nonvolatile memory devices and methods of operating the same and, more particularly, to single poly nonvolatile memory (NVM) cells, arrays thereof, and methods of operating the same.

2. Related Art

Recently, NVM devices have become very attractive as candidates for memory devices embedded in system-on-chip (SOC) packages also, referred to as SOC embedded memory devices. However, there may be some limitations in employing the NVM devices as the SOC embedded memory devices since general NVM devices are fabricated using a double poly process that is quite different from a single poly process corresponding to a standard complementary metal-oxide-semiconductor (CMOS) process used in fabrication of logic devices such as application specific integrated circuit (ASIC) devices.

Moreover, since the general NVM devices may be fabricated to have a stacked gate structure including a floating gate and a control gate electrode, complicated processes may be required to form the floating gate and the control gate electrode. In addition, since the floating gate and the control gate electrode have to be stacked, the possibility of misalignment between the floating gate and the control gate electrode may increase during some fabrication processes such as an etch process, thus reducing fabrication yield of the general NVM devices. Accordingly, there are some issues in single poly NVM devices fabricated using the standard CMOS process to realize the SOC embedded memory devices.

SUMMARY

Various embodiments are directed to single poly NVM cells, arrays thereof, and methods of operating the same.

According to an embodiment, a single poly NVM cell includes a first N-type well region and a second N-type well region spaced apart from each other by a P-type semiconductor layer, a first active region and a second active region disposed in the first N-type well region and the second N-type well region, respectively, a P-channel floating gate transistor including a floating gate disposed in the first active region, a P-type drain region disposed in the first active region, and a P-type junction region disposed in the first active region, wherein the floating gate extends to over the second active region, a P-channel read selection transistor including a read selection gate electrode disposed in the first active region, the P-type junction region disposed in the first active region, and a P-type source region disposed in the first active region, and an interconnection line connecting the first N-type well region to the P-type source region of the P-channel read selection transistor.

According to another embodiment, a single poly NVM cell includes a P-channel floating gate transistor having a floating gate, a drain terminal, and a junction terminal, a P-channel read selection transistor having a read selection gate terminal and a source terminal and sharing the junction terminal with the P-channel floating gate transistor, a word line coupled to the read selection gate terminal, a tunnel/source line coupled to the source terminal, a bit line coupled to the drain terminal, and an array control gate line coupled to the floating gate through a first capacitive element. The floating gate and the tunnel/source line are coupled to each other through a second capacitive element.

According to another embodiment, there is provided a method of operating a single poly NVM cell including a first N-type well region and a second N-type well region spaced apart from each other by a P-type semiconductor layer, a first active region and a second active region disposed in the first N-type well region and the second N-type well region, respectively, a P-channel floating gate transistor including a floating gate disposed in the first active region, a P-type drain region disposed in the first active region, and a P-type junction region disposed in the first active region, wherein the floating gate extends to over the second active region, a P-channel read selection transistor including a read selection gate electrode disposed in the first active region, the P-type junction region disposed in the first active region, and a P-type source region disposed in the first active region, and an interconnection line connecting the first N-type well region to the P-type source region of the P-channel read selection transistor. The method includes programming a selected unit cell by electrically floating the word line and the bit line; and applying a positive program voltage and a ground voltage to the array control gate line and the tunnel/source line, respectively.

According to another embodiment, a single poly NVM cell array includes unit cells respectively located at cross points of rows and columns, array control gate lines, each of which is coupled to unit cells arrayed in any one of the rows, word lines, each of which is coupled to unit cells arrayed in any one of the rows, bit lines, each of which is coupled to unit cells arrayed in any one of the columns, and tunnel/source lines, each of which is coupled to unit cells arrayed in any one of the columns. Each of the unit cells comprises a first N-type well region and a second N-type well region spaced apart from each other by a P-type semiconductor layer, a first active region and a second active region disposed in the first N-type well region and the second N-type well region, respectively, a P-channel floating gate transistor including a floating gate disposed in the first active region, a P-type drain region disposed in the first active region and coupled to any one of the bit lines, and a P-type junction region disposed in the first active region and electrically floated, wherein the floating gate extends to the second active region and is coupled to any one of the array control gate lines through a capacitive element, and a P-channel read selection transistor including a read selection gate electrode disposed in the first active region and coupled to any one of the word lines, a P-type source region disposed in the first active region and coupled to any one of the tunnel/source lines, and the P-type junction region electrically floated.

According to another embodiment, there is provided a method of operating a single poly NVM cell including unit cells respectively located at cross points of rows and columns; array control gate lines, each of which is coupled to unit cells arrayed in any one of the rows; word lines, each of which is coupled to unit cells arrayed in any one of the rows; bit lines, each of which is coupled to unit cells arrayed in any one of the columns; and tunnel/source lines, each of which is coupled to unit cells arrayed in any one of the columns, wherein each of the unit cells includes a P-channel floating gate transistor and a P-channel read selection transistor, wherein the P-channel floating gate transistor includes a floating gate coupled to any one of the array control gate lines through a capacitive element, a drain terminal coupled to any one of the bit lines, and a junction terminal, and wherein the P-channel read selection transistor includes a read selection gate electrode coupled to any one of the word lines and a source terminal coupled to any one of the tunnel/source lines and sharing the junction terminal with the P-channel floating gate transistor The method includes programming or erasing a selected unit cell by applying a positive bias voltage and a ground voltage to the array control gate lines and the tunnel/source lines, while the word lines and the bit lines are electrically floated.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
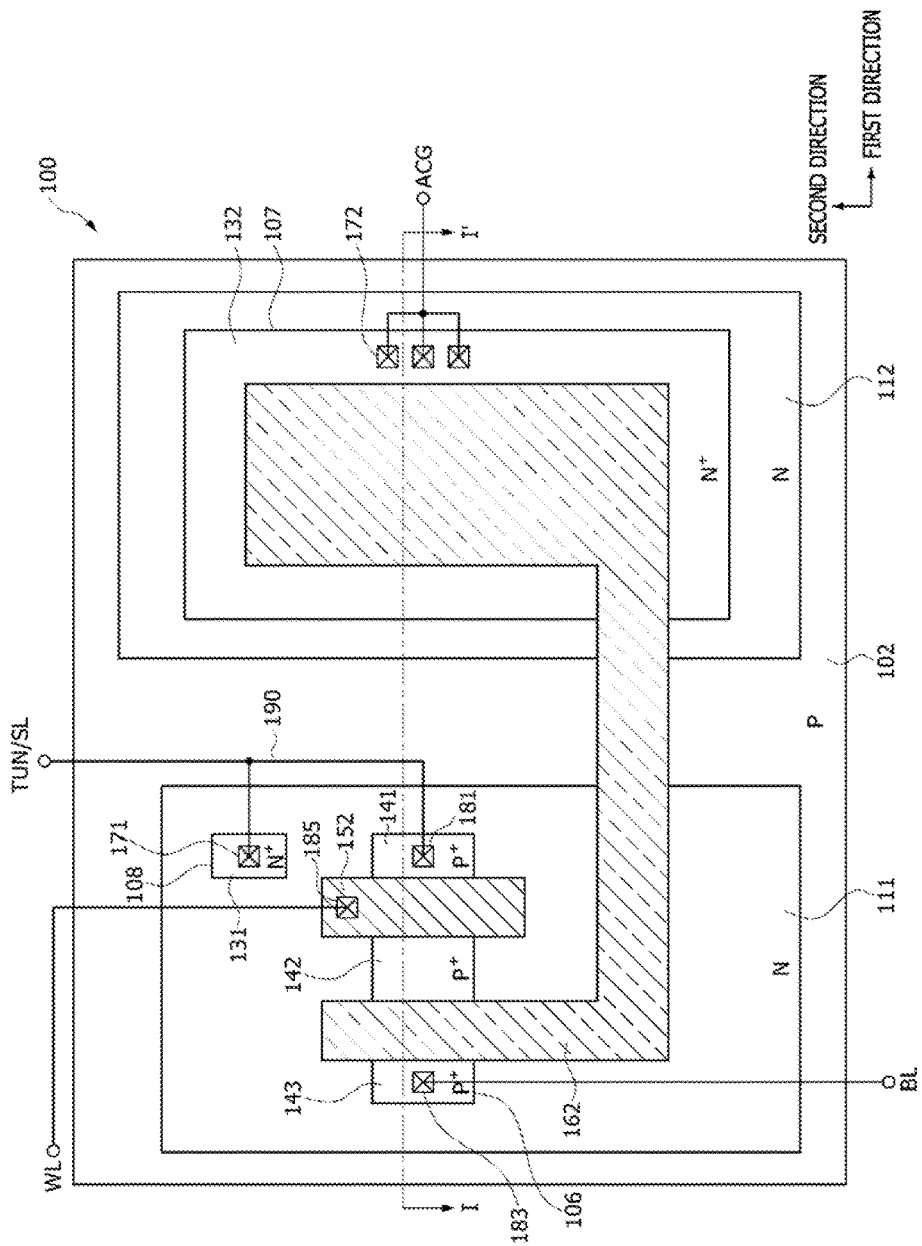
FIG. 1 is a layout diagram illustrating a single poly nonvolatile memory cell according to an embodiment.
Figure 2:
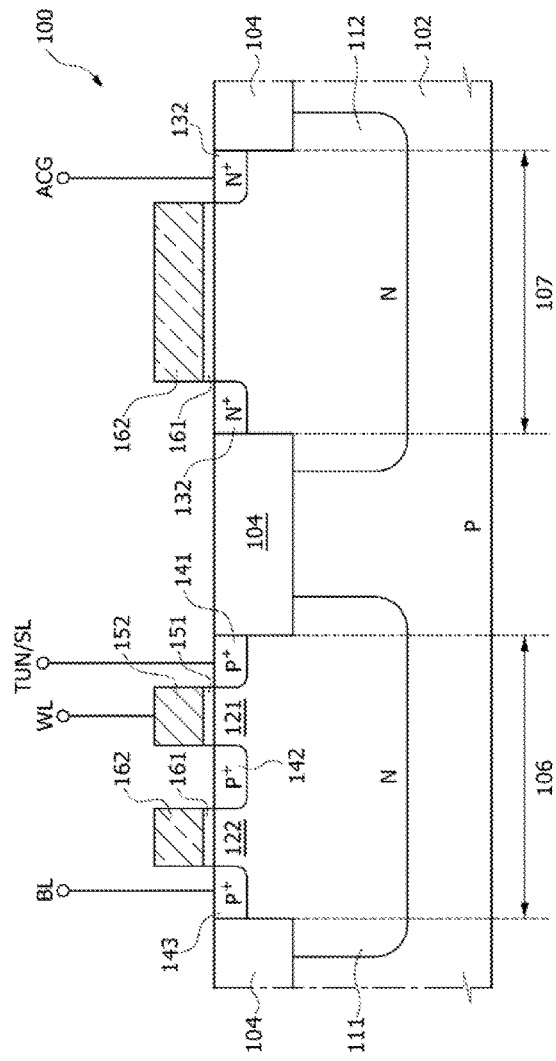
FIG. 2 is a cross-sectional view taken along the line I-I' of FIG. 1.

FIG. 1 is a layout diagram illustrating a single poly nonvolatile memory (NVM) cell 100 according to an embodiment, and FIG. 2 is a cross-sectional view taken along the line I-I' of FIG. 1. Referring to FIGS. 1 and 2, the single poly NVM cell 100 may include a first N-type well region 111 and a second N-type well region 112 disposed in a P-type semiconductor layer 102. The P-type semiconductor layer 102 may be a P-type semiconductor substrate.

In some embodiments, the P-type semiconductor layer 102 may be a P-type doping region formed in a semiconductor substrate, for example, a P-type well region. Alternatively, the P-type semiconductor layer 102 may be a P-type epitaxial layer grown on a semiconductor substrate.

The first N-type well region 111 and the second N-type well region 112 may be separated from each other by a portion of the P-type semiconductor layer 102 in a first direction such as, a horizontal direction in FIG. 1. In some embodiments, each of the first and second N-type well regions 111 and 112 may have a rectangular shape in a plan view. In such a case, a planar area of the first N-type well region 111 may be less than a planar area of the second N-type well region 112.

The first and second N-type well regions 111 and 112 may be formed using the same ion implantation process. In such a case, the first and second N-type well regions 111 and 112 may be formed to have substantially the same impurity concentration and substantially the same junction depth.

A first active region 106 may be disposed in the first N-type well region 111. In some embodiments, the first active region 106 may have a stripe shape extending in the first direction in a plan view. A second active region 107 may be disposed in the second N-type well region 112. In some embodiments, the second active region 107 may have a rectangular shape in a plan view. The first and second N-type well regions 111 and 112 may be defined by a trench isolation layer 104.

A third active region 108 may be disposed in the first N-type well region 111 spaced apart from the first active region 106. The third active region 108 may be spaced apart from the first active region 106 in a second direction perpendicular to the first direction. However, in some embodiments, the second direction may be a degree other than 90 degrees so that the third active region 108 and the first active region 106 may be spaced apart without increasing a planar area of the first N-type well region 111. For example, the third active region 108 may be spaced apart from the first active region 106 in the first direction or in a diagonal direction between the first and second directions without increasing a planar area of the first N-type well region 111.

A P-type source region 141, a P-type junction region 142 and a P-type drain region 143 may be disposed in the first active region 106. The P-type source region 141, the P-type junction region 142 and the P-type drain region 143 may be spaced apart from each other in the first direction. The P-type source region 141 and the P-type junction region 142 may be spaced apart from each other by a first channel region 121, and the P-type junction region 142 and the P-type drain region 143 may be spaced apart from each other by a second channel region 122. Although not shown in the drawings, each of the P-type source region 141, the P-type junction region 142 and the P-type drain region 143 may have a lightly doped drain (LDD) structure.

A first N-type contact region 131 may be disposed in the third active region 108. The first N-type contact region 131 may be connected to an interconnection line 190 through a first contact 171, and the P-type source region 141 may also be connected to the interconnection line 190 through a source contact 181. The interconnection line 190 may be coupled to a tunnel/source line TUN/SL.

The P-type junction region 142 may be floated. The P-type drain region 143 may be coupled to a bit line BL through a drain contact 183. A second N-type contact region 132 may be disposed in the second active region 107. The second N-type contact region 132 may have a rectangular loop shape, a portion of which is opened in a plan view. The second N-type contact region 132 may be coupled to an array control gate line ACG through at least one second contact 172.

A first gate insulation layer 151 and a read selection gate electrode 152 may be stacked on the first channel region 121 of the first active region 106. In some embodiments, the first gate insulation layer 151 may be comprised of an oxide layer, and the read selection gate electrode 152 may be comprised of a polysilicon layer. The read selection gate electrode 152 may cross the first channel region 121 of the first active region 106 and may extend in the second direction to have a stripe shape in a plan view. The read selection gate electrode 152 may be disposed on a portion of the first N-type well region 111 in a plan view. That is, the read selection gate electrode 152 may not extend onto an outside region of the first N-type well region 111. The read selection gate electrode 152 may be coupled to a word line WL through a gate contact 185.

A second gate insulation layer 161 and a floating gate 162 may be disposed on the second channel region 122 of the first active region 106. In some embodiments, the second gate insulation layer 161 may be comprised of an oxide layer, and the floating gate 162 may be comprised of a polysilicon layer. The second gate insulation layer 161 and the floating gate 162 may cross the second channel region 122 of the first active region 106 and may extend in the second direction to have a stripe shape in a plan view.

The second gate insulation layer 161 and the floating gate 162 may further extend onto the P-type semiconductor layer 102 between the first and second N-type well regions 111 and 112, the second N-type well region 112, and the second active region 107. The second gate insulation layer 161 and the floating gate 162 extending onto the second active region 107 may overlap with the second N-type well region 112. Thus, the floating gate 162, the second gate insulation layer 161 and the second N-type well region 112 in the second active region 107 may constitute a MOS capacitor.

Figure 3:
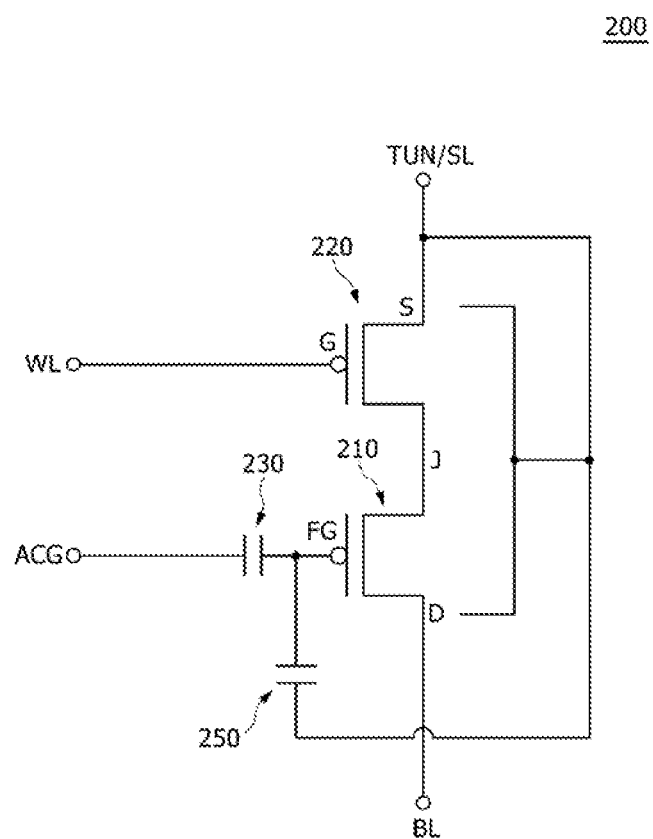
FIG. 3 is an equivalent circuit diagram of a single poly nonvolatile memory cell according to an embodiment.

FIG. 3 is an equivalent circuit diagram 200 of a single poly nonvolatile memory cell according to an embodiment. Referring to FIG. 3, the equivalent circuit diagram 200 of the single poly nonvolatile memory cell may include a P-channel floating gate transistor 210 and a P-channel read selection transistor 220. The P-channel floating gate transistor 210 may have a floating gate FG, a drain terminal D, and a junction terminal J. The P-channel floating gate transistor 210 may share the junction terminal 3 with the P-channel read selection transistor 220. The floating gate FG of the P-channel floating gate transistor 210 may be coupled to the array control gate line ACG of FIGS. 1 and 2 through a first capacitive element 230.

The floating gate FG of the P-channel floating gate transistor 210 may also be coupled to the tunnel/source line (TUN/SL of FIGS. 1 and 2) through a second capacitive element 250. The array control gate line ACG coupled to the first capacitive element 230 and the tunnel/source line TUN/SL coupled to the second capacitive element 250 may be connected in parallel to the floating gate FG of the P-channel floating gate transistor 210 when viewed from the equivalent circuit diagram of FIG. 3. The drain terminal D of the P-channel floating gate transistor 210 may be coupled to the bit line (BL of FIGS. 1 and 2).

The P-channel read selection transistor 220 may have a gate terminal G, a source terminal S and the junction terminal J. The gate terminal G and the source terminal S of the P-channel read selection transistor 220 may be coupled to the word line (WL of FIGS. 1 and 2) and the tunnel/source line TUN/SL, respectively. The junction terminal J shared by the P-channel floating gate transistor 210 and the P-channel read selection transistor 220 may be floated.

The P-channel floating gate transistor 210 may be comprised of the P-type junction region 142, the second channel region 122, the P-type drain region 143, the second gate insulation layer 161 and the floating gate 162 of the single poly NVM cell 100 which is described with reference to FIGS. 1 and 2. The P-channel read selection transistor 220 may be comprised of the P-type source region 141, the first channel region 121, the P-type junction region 142, the first gate insulation layer 151 and the read selection gate electrode 152 of the single poly NVM cell 100 which is described with reference to FIGS. 1 and 2. The first capacitive element 230 may be a MOS capacitive element which is comprised of the second gate insulation layer 161, the floating gate 162 and the second N-type well region 112 in the second active region 107 of the single poly NVM cell 100. The second capacitive element 250 may be a MOS capacitive element which is comprised of the second gate insulation layer 161, the floating gate 162 and the first channel region 121 in the first active region 106 of the single poly NVM cell 100.

The single poly NVM cell 100 according to an embodiment may be programmed or erased regardless of the read selection transistor 220. The read selection transistor 220 may serve as a selection transistor only in a read operation. Thus, the program operation and the erasure operation of the single poly NVM cell 100 may be executed by a Fowler-Nordheim (F-N) tunneling mechanism. No negative bias voltage may be used in the program operation, the erasure operation and the read operation. Thus, a negative charge pump circuit for generating the negative bias voltage may not be required to operate the single poly NVM cell 100.

Moreover, the program operation and the erasure operation may be executed even without using a word line decoder for turning on the read selection transistor 220. That is, the program operation or the erasure operation may be executed using bias voltages applied to the array control gate line ACG and the tunnel/source line TUN/SL even without applying a bias voltage to the word line WL. Thus, a decoding circuit that is, a decoder for the program operation and the erasure operation may be simplified. These advantages may lead to reduction of a memory cell area. The program operation, the erasure operation and the read operation of the single poly NVM cell 100 having the aforementioned configuration will be described more fully hereinafter.

Figure 4:
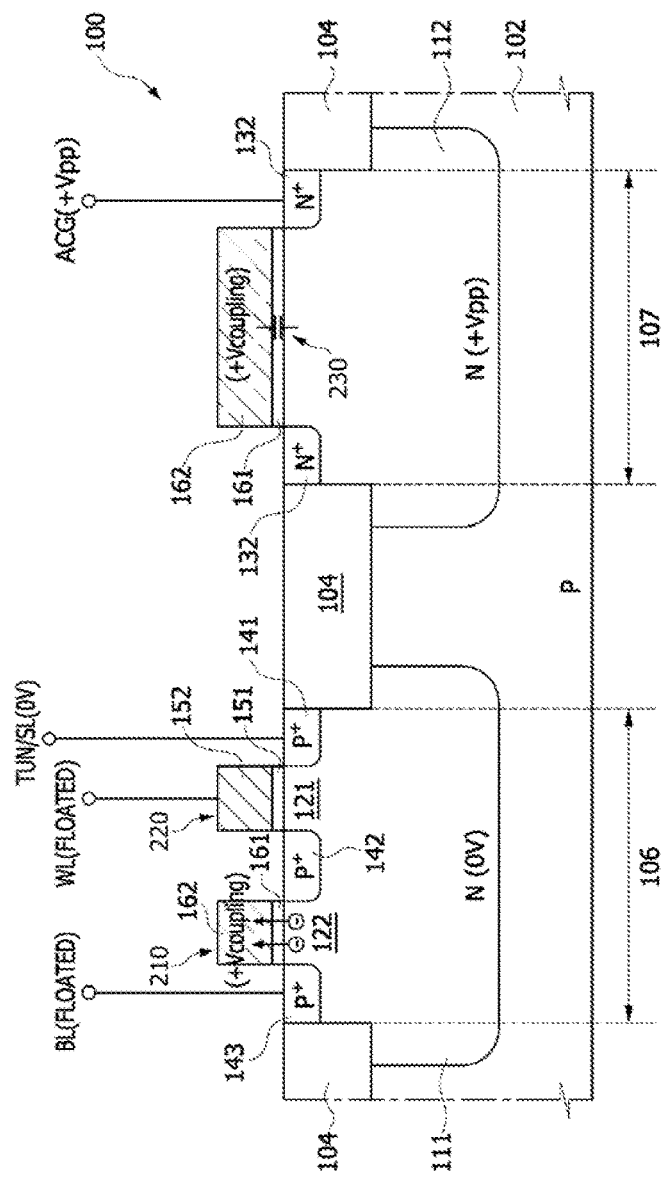
FIG. 4 is a cross-sectional view illustrating a program operation of a single poly nonvolatile memory cell according to an embodiment.

FIG. 4 is a cross-sectional view illustrating a program operation of the single poly NVM cell 100 according to an embodiment. The cross-section view of FIG. 4 is taken along the line I-I' of FIG. 1. In FIG. 4, the same reference numerals or designators as used in FIGS. 1 and 2 denote the same elements. Referring to FIG. 4, to execute the program operation of the single poly NVM cell 100, a positive program voltage +Vpp may be applied to the array control gate line ACG and a ground voltage may be applied to the tunnel/source line TUN/SL. In addition, the word line WL and the bit line BL may be floated.

Since the word line WL is floated, the program operation of the single poly NVM cell 100 may not be affected by the P-channel read selection transistor 220 that is comprised of the P-type source region 141, the first channel region 121, the P-type junction region 142, the first gate insulation layer 151 and the read selection gate electrode 152.

In the program operation according to the present embodiment, no negative bias voltage is applied to the array control gate line ACG and the tunnel/source line TUN/SL. The positive program voltage +Vpp applied to the array control gate line ACG may induce a coupling voltage +Vcoupling at the floating gate 162 due to presence of the first capacitive element 230 comprised of the second gate insulation layer 161, the floating gate 162 and the second N-type well region 112.

The positive program voltage +Vpp may be at such a level that the coupling voltage +Vcoupling induced at the floating gate 162 has a sufficient level to cause an F-N tunneling phenomenon in the P-channel floating gate transistor 210. In some embodiments, the positive program voltage +Vpp may be about +20 volts when the single poly NVM cell 100 including the first capacitive element 230 has a cell coupling ratio of about 90% or higher.

The positive program voltage +Vpp applied to the array control gate line ACG may be transmitted to the second N-type well region 112. A ground voltage applied to the tunnel/source line TUN/SL may be transmitted to the first N-type well region 111 through the first N-type contact region (131 of FIG. 1). Thus, a potential difference corresponding to the coupling voltage +Vcoupling may be created across the second gate insulation layer 161 between the floating gate 162 and the first N-type well region 111 in the first active region 106. In such a case, electrons in the second channel region 122 may be injected into the floating gate 162 through the second gate insulation layer 161 due to an F-N tunneling mechanism.

When the electrons in the second channel region 122 are injected into the floating gate 162 by the F-N tunneling mechanism, a threshold voltage of a MOS structure comprised of the second channel region 122, the second gate insulation layer 161 and the floating gate 162 may be lowered. As a result, the P-channel floating gate transistor 210 of the single poly NVM cell 100 may have an on-state to program the single poly NVM cell 100.

Figure 5:
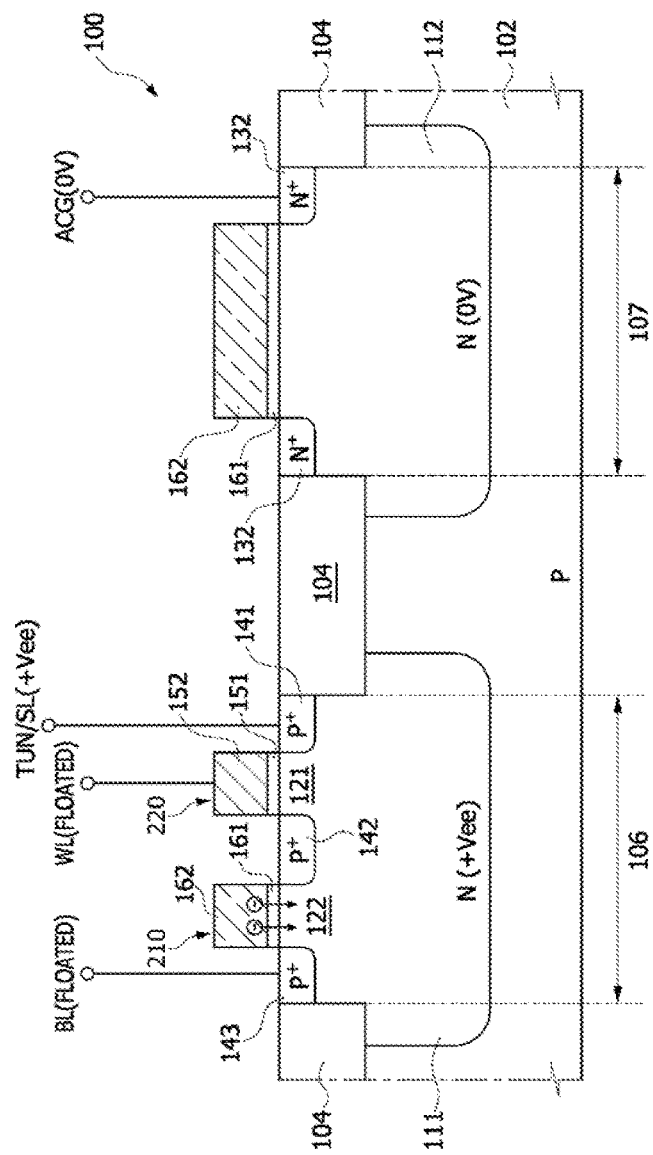
FIG. 5 is a cross-sectional view illustrating an erasure operation of a single poly nonvolatile memory cell according to an embodiment.

FIG. 5 is a cross-sectional view illustrating an erasure operation of the single poly nonvolatile memory cell 100 according to an embodiment. The cross-section view of FIG. 5 is taken along the line I-I' of FIG. 1. In FIG. 5, the same reference numerals or designators as used in FIGS. 1 and 2 denote the same elements. Referring to FIG. 5, to execute the erasure operation of the single poly NVM cell 100, a ground voltage may be applied to the array control gate line ACG and a positive erasure voltage +Vee may be applied to the tunnel/source line TUN/SL. In addition, the word line WL and the bit line BL may be floated.

Since the word line WL is floated, the erasure operation of the single poly NVM cell 100 may not be affected by the P-channel read selection transistor 220 that is comprised of the P-type source region 141, the first channel region 121, the P-type junction region 142, the first gate insulation layer 151 and the read selection gate electrode 152. In the erasure operation according to the present embodiment, no negative bias voltage is applied to the array control gate line ACG and the tunnel/source line TUN/SL.

Under the above erasure bias condition, a coupling voltage induced at the floating gate 162 may be close to a ground voltage applied to the array control gate line ACG when a cell coupling ratio of the single poly NVM cell 100 is high. Thus, the positive erasure voltage +Vee applied to the tunnel/source line TUN/SL may be at a level sufficient to cause an F-N tunneling phenomenon so that electrons in the floating gate 162 are injected into the first N-type well region 111. In some embodiments, the positive erasure voltage +Vee may be set to about +20 volts.

When a ground voltage is applied to the array control gate line ACG, the second N-type well region 112 may also be grounded. Moreover, a coupling voltage induced at the floating gate 162 may be close to a ground voltage, as described above. The positive erasure voltage +Vee applied to the tunnel/source line TUN/SL may be transmitted to the first N-type well region 111 through the first N-type contact region (131 of FIG. 1).

Thus, a potential difference between the coupling voltage induced at the floating gate 162 and the positive erasure voltage +Vee applied to the first N-type well region 111 may be created across the second gate insulation layer 161 between the floating gate 162 and the first N-type well region 111 in the first active region 106. In such a case, electrons in the floating gate 162 may be injected into the second channel region 122 through the second gate insulation layer 161 due to an F-N tunneling mechanism. When the electrons are removed from the floating gate 162, a threshold voltage of the MOS structure comprised of the second channel region 122, the second gate insulation layer 161 and the floating gate 162 may increase. As a result, the P-channel floating gate transistor 210 of the single poly NVM cell 100 may have an off-state to erase the single poly NVM cell 100.

Figure 6:
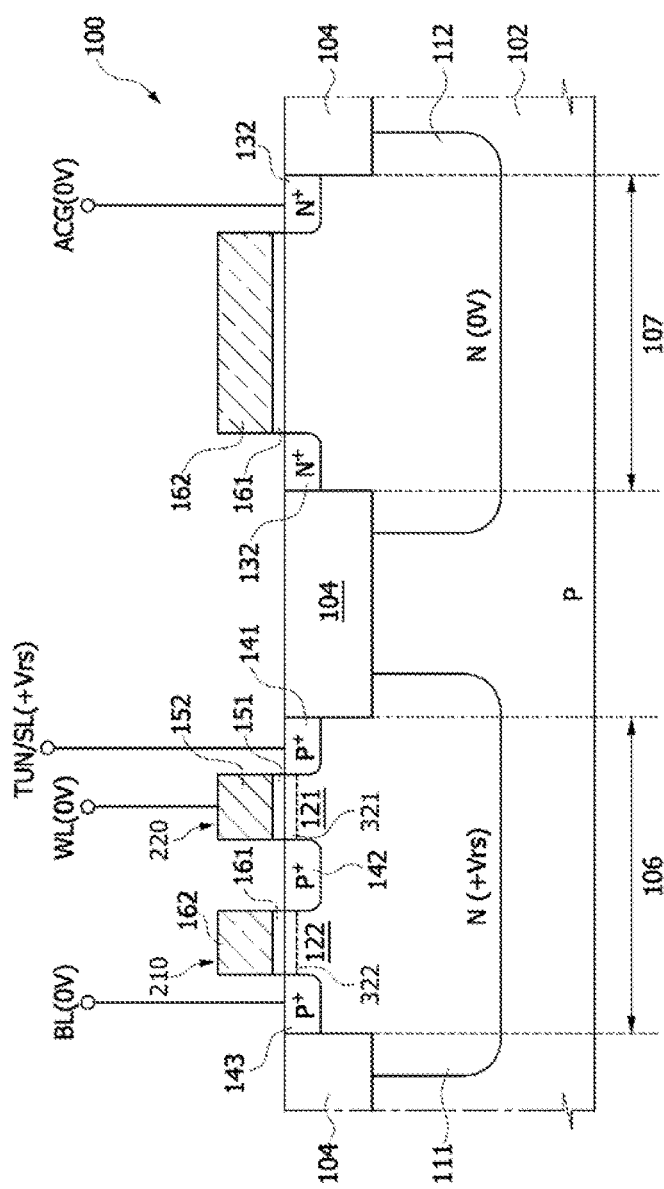
FIG. 6 is a cross-sectional view illustrating a read operation of a single poly nonvolatile memory cell according to an embodiment.

FIG. 6 is a cross-sectional view illustrating a read operation of the single poly nonvolatile memory cell 100 according to an embodiment. The cross-section view of FIG. 6 is taken along the line I-I' of FIG. 1. In FIG. 6, the same reference numerals or designators as used in FIGS. 1 and 2 denote the same elements.

Referring to FIG. 6, to execute the read operation of the single poly NVM cell 100, a ground voltage may be applied to the array control gate line ACG and a positive read source voltage +Vrs may be applied to the tunnel/source line TUN/SL. In some embodiments, the positive read source voltage +Vrs may be about +5 volts. In addition, both of the word line WL and the bit line BL may be grounded. In the erasure operation according to the present embodiment, no negative bias voltage is applied to the array control gate line ACG and the tunnel/source line TUN/SL.

When a ground voltage is applied to the array control gate line ACG, the second N-type well region 112 may also be grounded. Moreover, a coupling voltage induced at the floating gate 162 may be close to a ground voltage, as described above. Since the word line WL and the bit line BL may be grounded, the P-channel read selection transistor 220 comprised of the P-type source region 141, the first channel region 121, the P-type junction region 142, the first gate insulation layer 151 and the read selection gate electrode 152 may be turned on to form a first P-type inversion layer 321 in the first channel region 121.

Thus, the positive read source voltage +Vrs applied to the tunnel/source line TUN/SL may be transmitted to the P-type junction region 142 through the first P-type inversion layer 321. When the single poly NVM cell 100 has a programmed state so that the P-channel floating gate transistor 210 of the single poly NVM cell 100 has a negative threshold voltage, a second P-type inversion layer 322 may be formed in the second channel region 122 since a positive coupling voltage close to a ground voltage is induced at the floating gate 162. In such a case, a current may flow from the P-type junction region 142 toward the bit line BL through the second P-type inversion layer 322 and the P-type drain region 143.

In contrast, when the single poly NVM cell 100 has an erased state so that the P-channel floating gate transistor 210 of the single poly NVM cell 100 has a positive threshold voltage, no inversion layer may be formed in the second channel region 122 even though a positive coupling voltage close to a ground voltage is induced at the floating gate 162. In such a case, no current may flow from the P-type junction region 142 toward the bit line BL through the second channel region 122 and the P-type drain region 143. Accordingly, it may be possible to read out information stored in the single poly NVM cell 100 by sensing a current flowing through the bit line BL.

Figure 7:
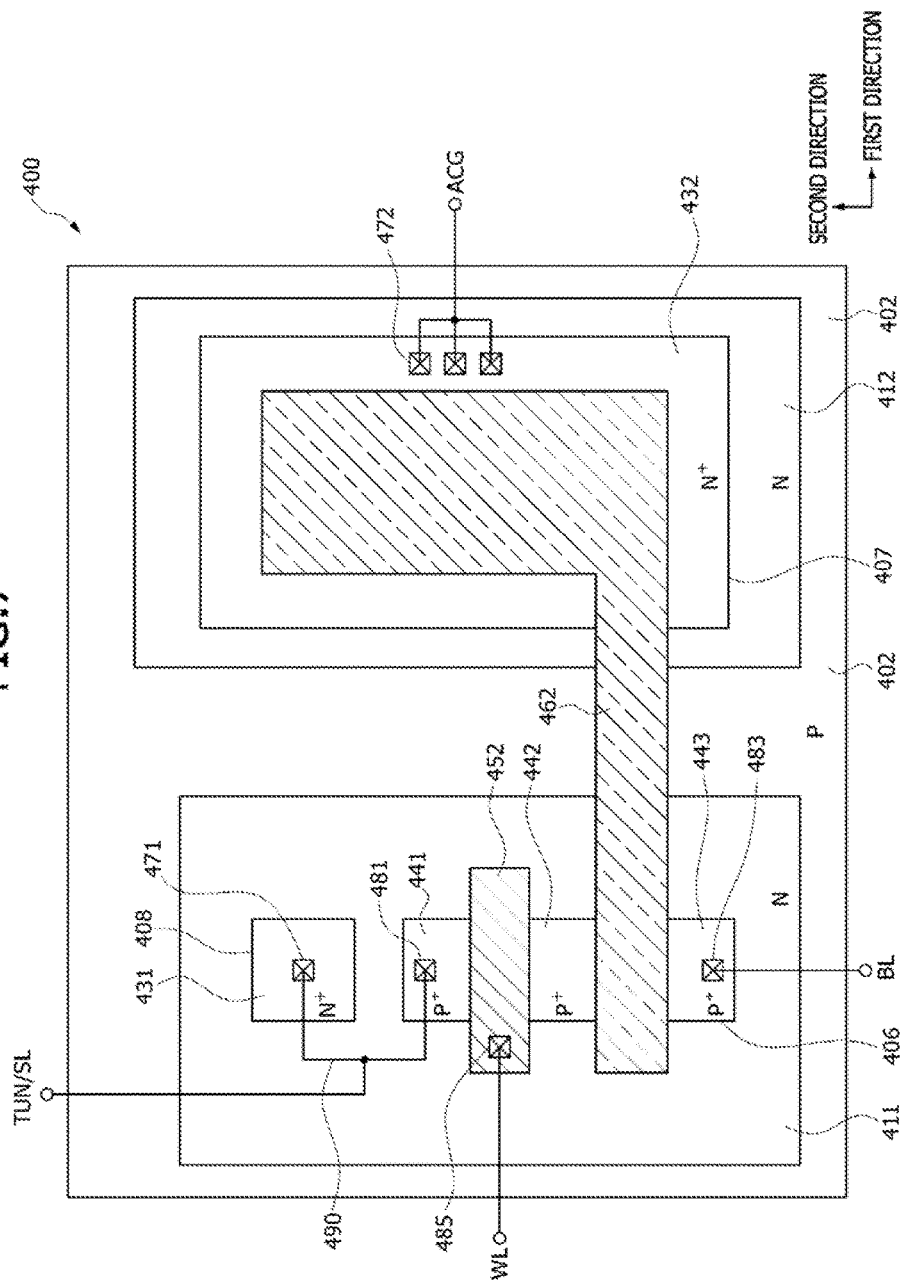
FIG. 7 is a layout diagram illustrating a single poly nonvolatile memory cell according to another embodiment.

FIG. 7 is a layout diagram illustrating a single poly nonvolatile memory cell 400 according to another embodiment. Referring to FIG. 7, the single poly nonvolatile memory cell 400 may be different from the single poly nonvolatile memory cell 100 of FIG. 1 in terms of disposition of a first active region 406, a read selection gate electrode 452 and a floating gate 462 in a first N-type well region 411.

That is, the first active region 406 may extend in the second direction to reduce a cell length in the first direction. More specifically, the first N-type well region 411 and a second N-type well region 412 may be disposed in a P-type semiconductor layer 402 spaced apart from each other in the first direction that is, a horizontal direction in FIG. 7. The first active region 406 may be defined in the first N-type well region 411. The first active region 406 may extend in the second direction that is, a vertical direction in FIG. 7 intersecting the first direction to have a stripe shape. A second active region 407 may be defined in the second N-type well region 412.

A third active region 408 may be disposed in the first N-type well region 411 spaced apart from the first active region 406. The third active region 408 may be spaced apart from the first active region 406 in the second direction. However, in some embodiments, the third active region 408 and the first active region 406 may be spaced apart from each other in a different direction from the second direction without increasing a planar area of the first N-type well region 411. For example, the third active region 408 may be spaced apart from the first active region 406 in the first direction or in a diagonal direction between the first and second directions without increasing a planar area of the first N-type well region 411.

A P-type source region 441, a P-type junction region 442 and a P-type drain region 443 may be disposed in the first active region 406. The P-type source region 441, the P-type junction region 442 and the P-type drain region 443 may be spaced apart from each other in the second direction. A region between the P-type source region 441 and the P-type junction region 442 may be defined as a first channel region, and a region between the P-type junction region 442 and the P-type drain region 443 may be defined as a second channel region.

A first N-type contact region 431 may be disposed in the third active region 408. The first N-type contact region 431 may be connected to a tunnel/source line TUN/SL through a first contact 471 and an interconnection line 490 connecting the first contact 471 to a source contact 481, and the P-type source region 441 may also be connected to the tunnel/source line TUN/SL through the source contact 481 and the interconnection line 490. The P-type junction region 442 may be floated. The P-type drain region 443 may be coupled to a bit line BL through a drain contact 483.

A second N-type contact region 432 may be disposed in the second active region 407. The second N-type contact region 432 may have a rectangular loop shape, a portion of which is opened in a plan view. The second N-type contact region 432 may be coupled to an array control gate line ACG through at least one second contact 472.

A first gate insulation layer (not shown) and a read selection gate electrode 452 may be stacked on the first channel region of the first active region 406. The read selection gate electrode 452 may cross the first channel region of the first active region 406 and may extend in the first direction to have a stripe shape in a plan view.

The read selection gate electrode 452 may be disposed on a portion of the first N-type well region 411 in a plan view. That is, the read selection gate electrode 452 may not extend onto an outside region of the first N-type well region 411. The read selection gate electrode 452 may be coupled to a word line WL through a gate contact 485.

A second gate insulation layer (not shown) and a floating gate 462 may be stacked on the second channel region of the first active region 406. The floating gate 462 may cross the second channel region of the first active region 406 and may extend in the first direction to have a stripe shape in a plan view. The floating gate 462 may further extend onto the P-type semiconductor layer 402 between the first and second N-type well regions 411 and 412, the second N-type well region 412, and the second active region 407.

Figure 8:
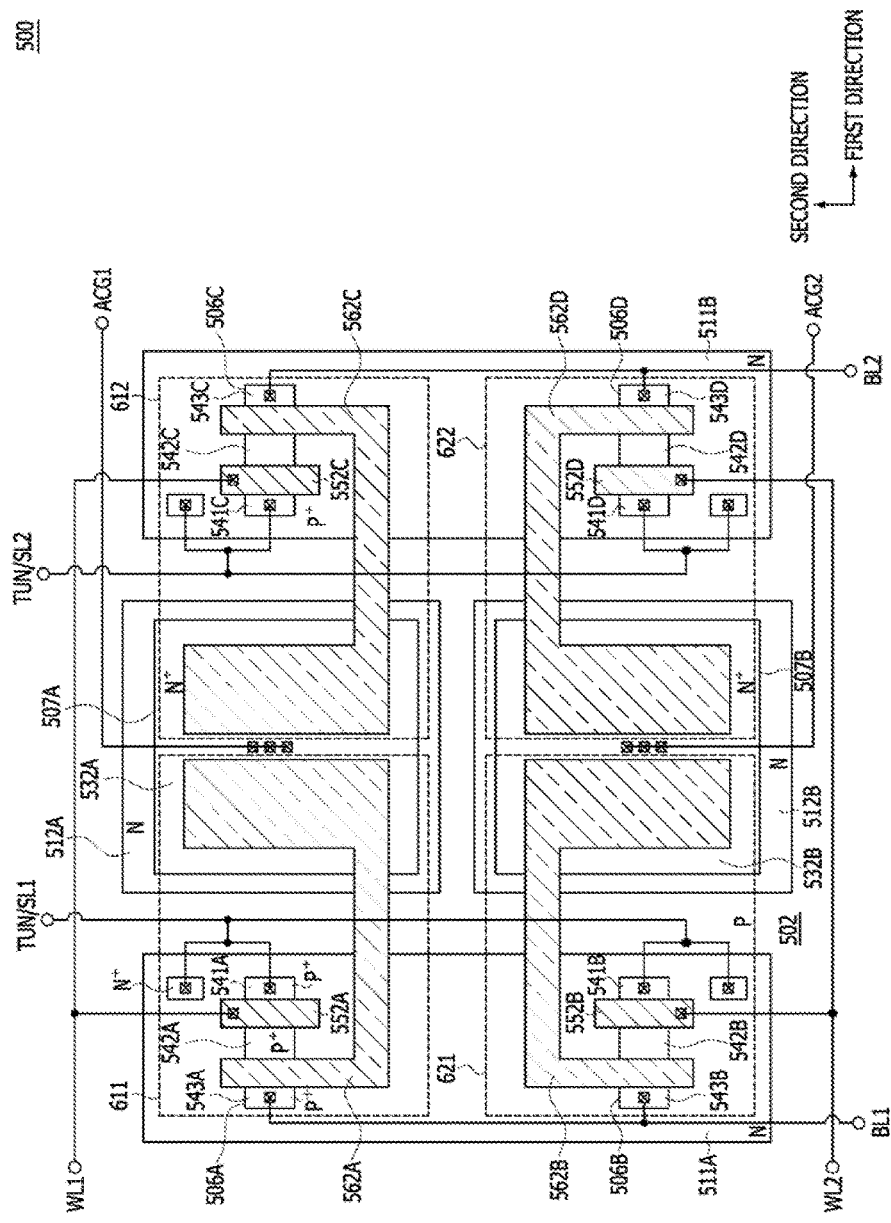
FIG. 8 is a layout diagram illustrating a single poly nonvolatile memory cell array according to an embodiment.

FIG. 8 is a layout diagram illustrating a single poly NVM cell array 500 according to an embodiment. Referring to FIG. 8, the single poly NVM cell array 500 may include a plurality of unit cells 611, 612, 621 and 622. The unit cells 611, 612, 621 and 622 may be located at cross points of a plurality of rows and a plurality of columns, respectively. For example, the unit cell 611 may be located at a cross point of a first row and a first column, and the unit cell 612 may be located at a cross point of the first row and a second column. In addition, the unit cell 621 may be located at a cross point of a second row and the first column, and the unit cell 622 may be located at a cross point of the second row and the second column.

Each of the unit cells 611, 612, 621 and 622 may have the same configuration as the single poly NVM cell 100 described with reference to FIGS. 1 and 2. Thus, a detailed description of each of the unit cells 611, 612, 621 and 622 constituting the single poly NVM cell array 500 will be omitted hereinafter. Although FIG. 8 illustrates an example in which the single poly NVM cell array 500 includes four unit cells 611, 612, 621 and 622, the present disclosure is not limited thereto. For example, in some embodiments, the single poly NVM cell array 500 may be repeatedly arrayed in a first direction and/or in a second direction intersecting the first direction to realize a single poly NVM cell array.

The single poly NVM cell array 500 may include first N-type well regions 511A and 511B as well as second N-type well regions 512A and 512B. The second N-type well regions 512A and 512B may be disposed between the first N-type well region 511A and the first N-type well region 511B that are spaced apart from each other in the first direction. Each of the second N-type well regions 512A and 512B may be spaced apart from the first N-type well regions 511A and 511B by a P-type semiconductor layer 502 in the first direction. The second N-type well regions 512A and 512B may be spaced apart from each other by the P-type semiconductor layer 502 in the second direction.

The unit cells 611 and 621 arrayed in the first column may share the first N-type well region 511A, and the unit cells 612 and 622 arrayed in the second column may share the first N-type well region 511B. The unit cells 611 and 612 arrayed in the first row may share the second N-type well region 512A, and the unit cells 621 and 622 arrayed in the second row may share the second N-type well region 512B.

First active regions 506A and 506B may be disposed in the first N-type well region 511A spaced apart from each other in the second direction. Each of the first active regions 506A and 506B may extend in the first direction to have a stripe shape in a plan view.

Likewise, first active regions 506C and 506D may be disposed in the first N-type well region 511B spaced apart from each other in the second direction. Each of the first active regions 506C and 506D may extend in the first direction to have a stripe shape in a plan view. A second active region 507A may be disposed in the second N-type well region 512A. A second active region 507B may be disposed in the second N-type well region 512B.

The unit cell 611 located at a cross point of the first row and the first column may include a read selection gate electrode 552A and a floating gate 562A disposed on the first active region 506A. The floating gate 562A may extend onto the second active region 507A. A P-type source region 541A and a P-type drain region 543A may be disposed in both ends of the first active region 506A, respectively. A P-type junction region 542A may be disposed in the first active region 506A between the read selection gate electrode 552A and the floating gate 562A. An N-type contact region 532A may be disposed in the second active region 507A.

The unit cell 612 located at a cross point of the first row and the second column may have a symmetric layout to the unit cell 611 with respect to a straight line (not shown) that passes through a central point of the second active region 507A and extends in the second direction. The N-type contact region 532A may surround the floating gate 562A of the unit cell 611 and a floating gate 562C of the unit cell 612 in a plan view.

The unit cell 621 located at a cross point of the second row and the first column may have a symmetric layout to the unit cell 611 with respect to a straight line (not shown) that passes through a central point of the first N-type well region 511A and extends in the first direction. The unit cell 622 located at a cross point of the second row and the second column may have a symmetric layout to the unit cell 612 with respect to a straight line (not shown) that passes through a central point of the first N-type well region 511B and extends in the first direction. The unit cell 621 and the unit cell 622 may be symmetric to each other with respect to a straight line (not shown) that passes through a central point of the second active region 507B and extends in the second direction.

An N-type contact region 532B may be disposed in the second active region 507B to surround a floating gate 562B of the unit cell 621 and a floating gate 562D of the unit cell 622 in a plan view.

The N-type contact region 532A may be coupled to a first array control gate line ACG1. Thus, the unit cells 611 and 612 arrayed in the first row may be coupled to the first array control gate line ACG1 in common. The N-type contact region 532B may be coupled to a second array control gate line ACG2. Thus, the unit cells 621 and 622 arrayed in the second row may be coupled to the second array control gate line ACG2 in common.

The read selection gate electrodes 552A and 552C of the unit cells 611 and 612 arrayed in the first row may be coupled to a first word line WL1 in common. Read selection gate electrodes 552B and 552D of the unit cells 621 and 622 arrayed in the second row may be coupled to a second word line WL2 in common.

The P-type source regions 541A and 541B of the unit cells 611 and 621 arrayed in the first column may be coupled to a first tunnel/source line TUN/SL1 in common. The P-type source regions 541C and 541D of the unit cells 612 and 622 arrayed in the second column may be coupled to a second tunnel/source line TUN/SL2 in common.

The P-type drain regions 543A and 543B of the unit cells 611 and 621 arrayed in the first column may be coupled to a first bit line BL1 in common. The P-type drain regions 543C and 543D of the unit cells 612 and 622 arrayed in the second column may be coupled to a second bit line BL2 in common.

Figure 9:
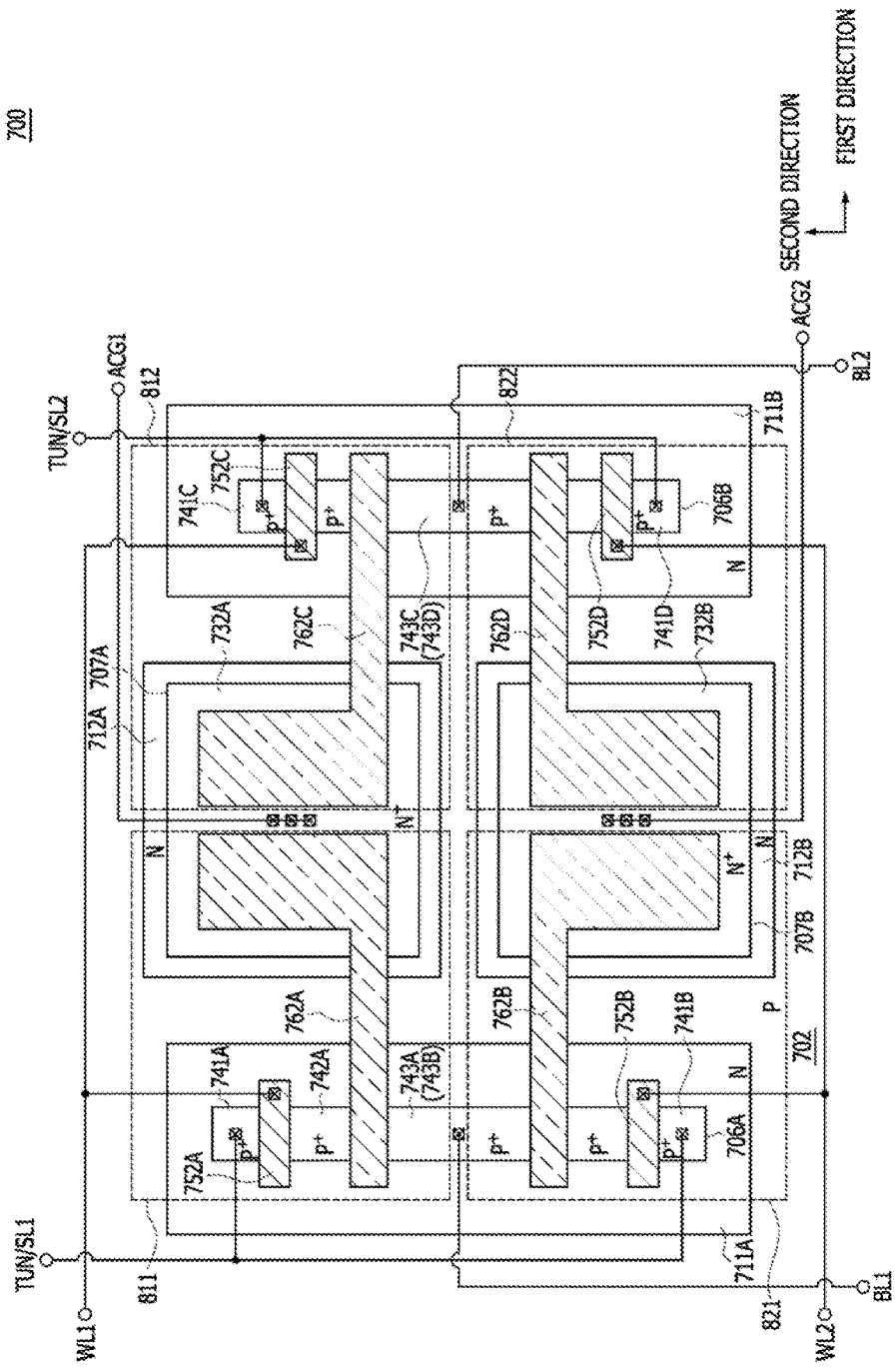
FIG. 9 is a layout diagram illustrating a single poly nonvolatile memory cell array according to another embodiment.

FIG. 9 is a layout diagram illustrating a single poly NVM cell array 700 according to another embodiment. Referring to FIG. 9, the single poly NVM cell array 700 may include a plurality of unit cells 811, 812, 821 and 822. The unit cells 811, 812, 821 and 822 may be located at cross points of a plurality of rows and a plurality of columns, respectively.

For example, the unit cell 811 may be located at a cross point of a first row and a first column, and the unit cell 812 may be located at a cross point of the first row and a second column. In addition, the unit cell 821 may be located at a cross point of a second row and the first column, and the unit cell 822 may be located at a cross point of the second row and the second column.

Each of the unit cells 811, 812, 821 and 822 may have the same configuration as the single poly NVM cell 400 described with reference to FIG. 7. Thus, a detailed description of each of the unit cells 811, 812, 821 and 822 constituting the single poly NVM cell array 700 will be omitted hereinafter. Although FIG. 9 illustrates an example in which the single poly NVM cell array 700 includes four unit cells 811, 812, 821 and 822, the present disclosure is not limited thereto. For example, in some embodiments, the single poly NVM cell array 700 may be repeatedly arrayed in a first direction and/or in a second direction intersecting the first direction to realize a single poly NVM cell array.

The single poly NVM cell array 700 may include first N-type well regions 711A and 711B as well as second N-type well regions 712A and 712B. The second N-type well regions 712A and 712B may be disposed between the first N-type well region 711A and the first N-type well region 711B that are spaced apart from each other in the first direction. Each of the second N-type well regions 712A and 712B may be spaced apart from the first N-type well regions 711A and 711B by a P-type semiconductor layer 702 in the first direction. The second N-type well regions 712A and 712B may be spaced apart from each other by the P-type semiconductor layer 702 in the second direction.

The unit cells 811 and 821 arrayed in the first column may share the first N-type well region 711A, and the unit cells 812 and 822 arrayed in the second column may share the first N-type well region 711B. The unit cells 811 and 812 arrayed in the first row may share the second N-type well region 712A, and the unit cells 821 and 822 arrayed in the second row may share the second N-type well region 712B.

A first active region 706A may be disposed in the first N-type well region 711A and may extend in the second direction to have a stripe shape, and a first active region 706B may be disposed in the first N-type well region 711B and may extend in the second direction to have a stripe shape.

A second active region 707A may be disposed in the second N-type well region 712A, and a second active region 707B may be disposed in the second N-type well region 712B. According to the present embodiment, the unit cells arrayed in each column may share a single active region. For example, the unit cells 811 and 821 arrayed in the first column may share the first active region 706A, and the unit cells 812 and 822 arrayed in the second column may share the first active region 706B.

The unit cell 811 located at a cross point of the first row and the first column may include a read selection gate electrode 752A and a floating gate 762A disposed on the first active region 706A. The floating gate 762A may extend onto the second active region 707A. A P-type junction region 742A may be disposed in the first active region 706A between the read selection gate electrode 752A and the floating gate 762A. A P-type source region 741A may be disposed in the first active region 706A adjacent to a sidewall of the read selection gate electrode 752A opposite to the P-type junction region 742A. A P-type drain region 743A also, acting as a P-type drain region 743B may be disposed in the first active region 706A adjacent to a sidewall of the floating gate 762A opposite to the P-type junction region 742A.

When "N" is an odd number, an $N^{th}$ unit cell and an $(N+1)^{th}$ unit cell among a plurality of unit cells arrayed in the same column may share the same P-type drain region. For example, the unit cell 811 located at a cross point of the first row and the first column and the unit cell 821 located at a cross point of the second row and the first column may share the P-type drain region 743A (or 743B).

An N-type contact region 732A may be disposed in the second active region 707A. When "M" is an odd number, an $M^{th}$ unit cell and an $(M+1)^{th}$ unit cell among a plurality of unit cells arrayed in the same row may share a single N-type contact region. For example, the unit cell 811 located at a cross point of the first row and the first column and the unit cell 812 located at a cross point of the first row and the second column may share the N-type contact region 732A.

The unit cell 812 located at a cross point of the first row and the second column may have a symmetric layout to the unit cell 811 with respect to a straight line (not shown) that passes through a central point of the second active region 707A and extends in the second direction. The N-type contact region 732A may surround the floating gate 762A of the unit cell 811 and a floating gate 762C of the unit cell 812 in a plan view.

The unit cell 821 located at a cross point of the second row and the first column may have a symmetric layout to the unit cell 811 with respect to a straight line (not shown) that passes through a central point of the first N-type well region 711A and extends in the first direction. The unit cell 821 located at a cross point of the second row and the first column may have a symmetric layout to the unit cell 811 with respect to a straight line (not shown) that passes through a central point of the first N-type well region 711A and extends in the first direction.

The unit cell 822 located at a cross point of the second row and the second column may have a symmetric layout to the unit cell 812 with respect to a straight line (not shown) that passes through a central point of the first N-type well region 711B and extends in the first direction. The unit cell 821 and the unit cell 822 may be symmetric to each other with respect to a straight line (not shown) that passes through a central point of the second active region 707B and extends in the second direction. An N-type contact region 732B may be disposed in the second active region 707B to surround a floating gate 762B of the unit cell 821 and a floating gate 762D of the unit cell 822 in a plan view.

The N-type contact region 732A may be coupled to a first array control gate line ACG1. Thus, the unit cells 811 and 812 arrayed in the first row may be coupled to the first array control gate line ACG1 in common. The N-type contact region 732B may be coupled to a second array control gate line ACG2. Thus, the unit cells 821 and 822 arrayed in the second row may be coupled to the second array control gate line ACG2 in common.

The read selection gate electrodes 752A and 752C of the unit cells 811 and 812 arrayed in the first row may be coupled to a first word line WL1 in common. Read selection gate electrodes 752B and 752D of the unit cells 821 and 822 arrayed in the second row may be coupled to a second word line WL2 in common.

The P-type source regions 741A and 741B of the unit cells 811 and 821 arrayed in the first column may be coupled to a first tunnel/source line TUN/SL1 in common. The P-type source regions 741C and 741D of the unit cells 812 and 822 arrayed in the second column may be coupled to a second tunnel/source line TUN/SL2 in common.

The P-type drain region 743A (or 743B) of the unit cells 811 and 821 arrayed in the first column may be coupled to a first bit line BL1 in common. The P-type drain region 743C (or 743D) of the unit cells 812 and 822 arrayed in the second column may be coupled to a second bit line BL2 in common. Although not shown in the drawings, all of drain regions of unit cells arrayed in the same column may be coupled to a single bit line in common even when the number of the unit cells arrayed in the same column is equal to or greater than three.

Figure 10:
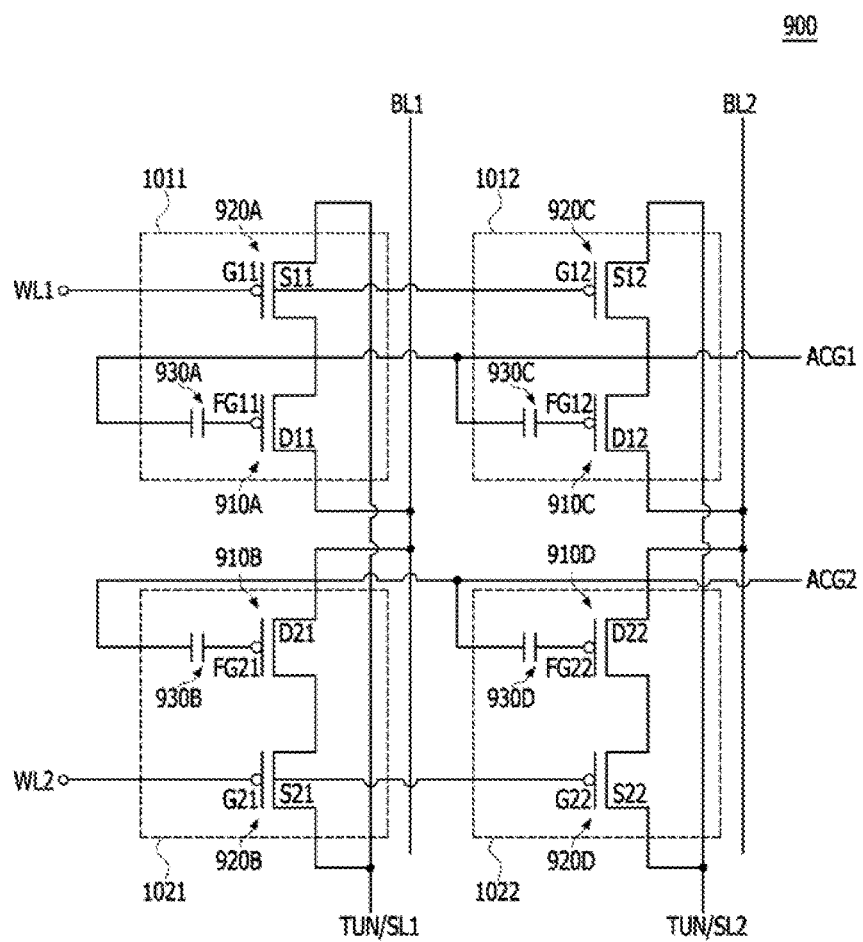
FIG. 10 is an equivalent circuit diagram of a single poly nonvolatile memory cell array according to an embodiment.

FIG. 10 is an equivalent circuit diagram 900 of a single poly NVM cell array according to an embodiment. The equivalent circuit diagram 900 may correspond to an equivalent circuit diagram of the single poly nonvolatile memory cell array 500 described with reference to FIG. 8 or an equivalent circuit diagram of the single poly nonvolatile memory cell array 700 described with reference to FIG. 9.

Referring to FIG. 10, first and second array control gate lines ACG1 and ACG2 as well as first and second word lines WL1 and WL2 may be parallel with rows, and first and second bit lines BL1 and BL2 as well as first and second tunnel/source lines TUN/SL1 and TUN/SL2 may be parallel with columns. However, in some embodiments, disposition of the array control gate lines ACG1 and ACG2, the word lines WL1 and WL2, the bit lines BL1 and BL2, and the tunnel/source lines TUN/SL1 and TUN/SL2 may be opposite to the above description. A plurality of unit cells 1011, 1012, 1021 and 1022 may be located at cross points of the rows and the columns, respectively.

The unit cell 1011 located at a cross point of a first row and a first column may include a P-channel floating gate transistor 910A and a P-channel read selection transistor 920A. The unit cell 1021 located at a cross point of a second row and the first column may include a P-channel floating gate transistor 910B and a P-channel read selection transistor 920B. The unit cell 1012 located at a cross point of the first row and a second column may include a P-channel floating gate transistor 910C and a P-channel read selection transistor 920C. The unit cell 1022 located at a cross point of the second row and the second column may include a P-channel floating gate transistor 910D and a P-channel read selection transistor 920D.

Gate electrodes G11 and G12 of the P-channel read selection transistors 920A and 920C of the unit cells 1011 and 1012 arrayed in the first row may be coupled to the first word line WL1 in common. Gate electrodes G21 and G22 of the P-channel read selection transistors 920B and 920D of the unit cells 1021 and 1022 arrayed in the second row may be coupled to the second word line WL2 in common.

Floating gates FG11 and FG12 of the P-channel floating gate transistors 910A and 910C of the unit cells 1011 and 1012 arrayed in the first row may be coupled to the first array control gate line ACG1 in common through capacitive elements 930A and 930B, respectively. Floating gates FG21 and FG22 of the P-channel floating gate transistors 910B and 910D of the unit cells 1021 and 1022 arrayed in the second row may be coupled to the second array control gate line ACG2 in common through capacitive elements 930B and 930D, respectively.

Source terminals S11 and S21 of the P-channel read selection transistors 920A and 920B of the unit cells 1011 and 1021 arrayed in the first column may be coupled to the first tunnel/source line TUN/SL1 in common. Drain terminals D11 and D21 of the P-channel floating gate transistors 910A and 910B of the unit cells 1011 and 1021 arrayed in the first column may be coupled to the first bit line BL1 in common.

Source terminals S12 and S22 of the P-channel read selection transistors 920C and 920D of the unit cells 1012 and 1022 arrayed in the second column may be coupled to the second tunnel/source line TUN/SL2 in common. Drain terminals D12 and D22 of the P-channel floating gate transistors 910C and 910D of the unit cells 1012 and 1022 arrayed in the second column may be coupled to the second bit line BL2 in common.

Figure 11:
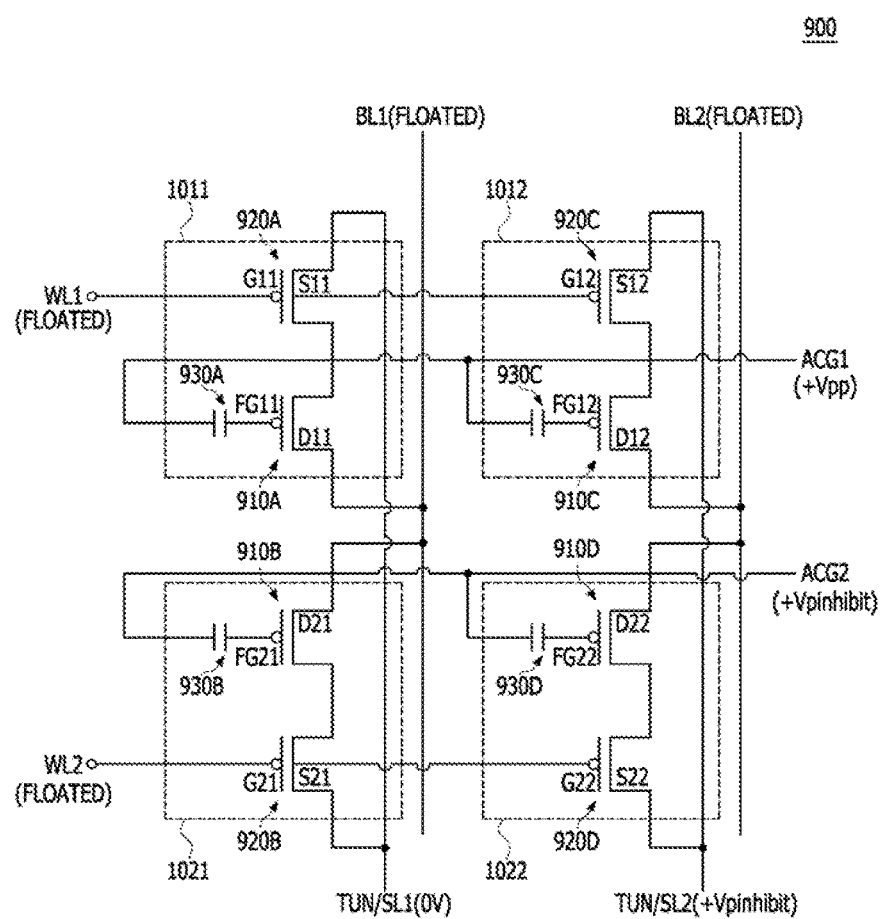
FIG. 11 is an equivalent circuit diagram illustrating a program operation of a selected unit cell in a single poly nonvolatile memory cell array according to an embodiment.

FIG. 11 is an equivalent circuit diagram illustrating a program operation of a selected unit cell in a single poly NVM cell array according to an embodiment. In FIG. 11, the same reference designators as used in FIG. 10 denote the same elements. Referring to FIG. 11, to program the unit cell 1011 hereinafter, referred to as a selected unit cell, located at a cross point of the first row and the first column, a positive program voltage +Vpp and a ground voltage may be applied to the first array control gate line ACG1 and the first tunnel/source line TUN/SL1 coupled to the selected unit cell 1011, respectively, while all of the word lines WL1 and WL2 and all of the bit lines BL1 and BL2 are floated.

In addition, a positive program inhibition voltage +Vpinhibit may be applied to the second array control gate line ACG2 coupled to non-selected unit cells 1021 and 1022 arrayed in the second row and the second tunnel/source line TUN/SL2 coupled to non-selected unit cells 1012 and 1022 arrayed in the second column.

The positive program voltage +Vpp may be sufficient for a coupling voltage induced at the floating gate FG11 of the selected unit cell 1011 to cause an F-N tunneling phenomenon in the P-channel floating gate transistor 910A of the selected unit cell 1011. In some embodiments, the positive program voltage +Vpp may be about +20 volts when the unit cells 1011, 1012, 1021 and 1022 are designed to have a cell coupling ratio of about 90% or higher.

The positive program inhibition voltage +Vpinhibit may be insufficient for coupling voltages induced at the floating gates FG12, FG21 and FG22 of the non-selected unit cells 1012, 1021 and 1022 to cause an F-N tunneling phenomenon in the P-channel floating gate transistors 910C, 910B and 910D of the non-selected unit cells 1012, 1021 and 1022. In some embodiments, the positive program inhibition voltage +Vpinhibit may have a level which is about 50% of the positive program voltage +Vpp. Under the above program bias condition, a program operation of the selected unit cell 1011 may be executed by the F-N tunneling mechanism described with reference to FIG. 4.

Figure 12:
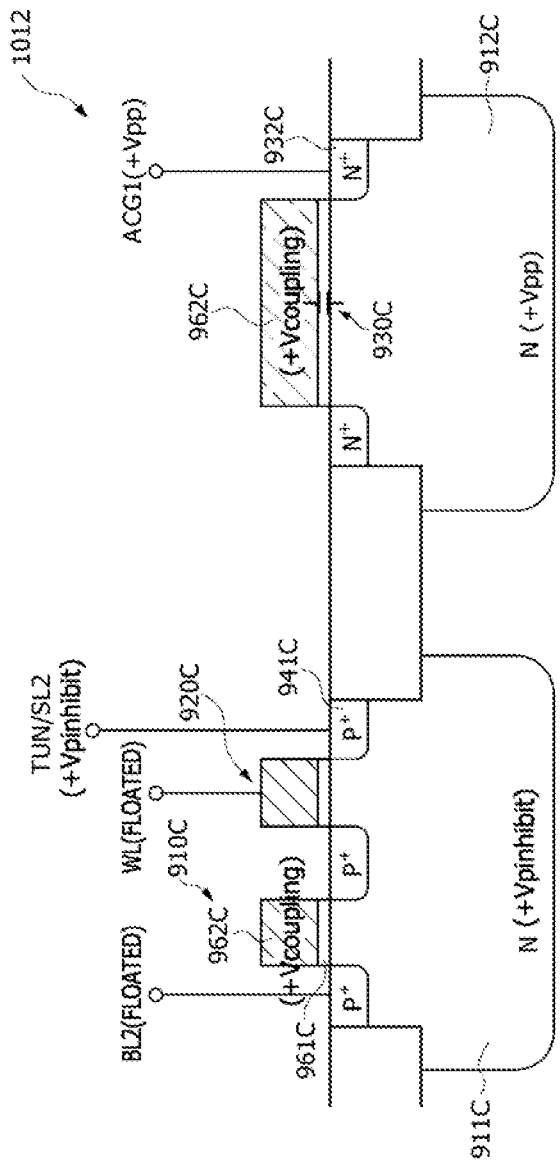
FIG. 12 is a cross-sectional view illustrating a program inhibition operation of a non-selected unit cell sharing an array control gate line with a selected unit cell in a single poly nonvolatile memory cell array according to an embodiment.

FIG. 12 is a cross-sectional view illustrating a program inhibition operation of the non-selected unit cell 1012 sharing the first array control gate line ACG1 with the selected unit cell 1011 in the single poly NVM cell array 900. Referring to FIG. 12, the positive program voltage +Vpp applied to the first array control gate line ACG1 of the non-selected unit cell 1012 may be transmitted to a second N-type well region 912C through an N-type contact region 932C. In addition, the positive program inhibition voltage +Vpinhibit applied to the second tunnel/source line TUN/SL2 may be transmitted to a first N-type well region 911C.

In such a case, a coupling voltage +Vcoupling may be induced at a floating gate 962C of the non-selected unit cell 1012 by a coupling operation of a capacitive element 930C. Thus, an electric field corresponding to a potential difference between the coupling voltage +Vcoupling and the positive program inhibition voltage +Vpinhibit may be created across a gate insulation layer 961C between the floating gate 962C and the first N-type well region 911C. Since the electric field created across the gate insulation layer 961C is insufficient to cause an F-N tunneling phenomenon, a program operation of the non-selected unit cell 1012 may be inhibited.

Figure 13:
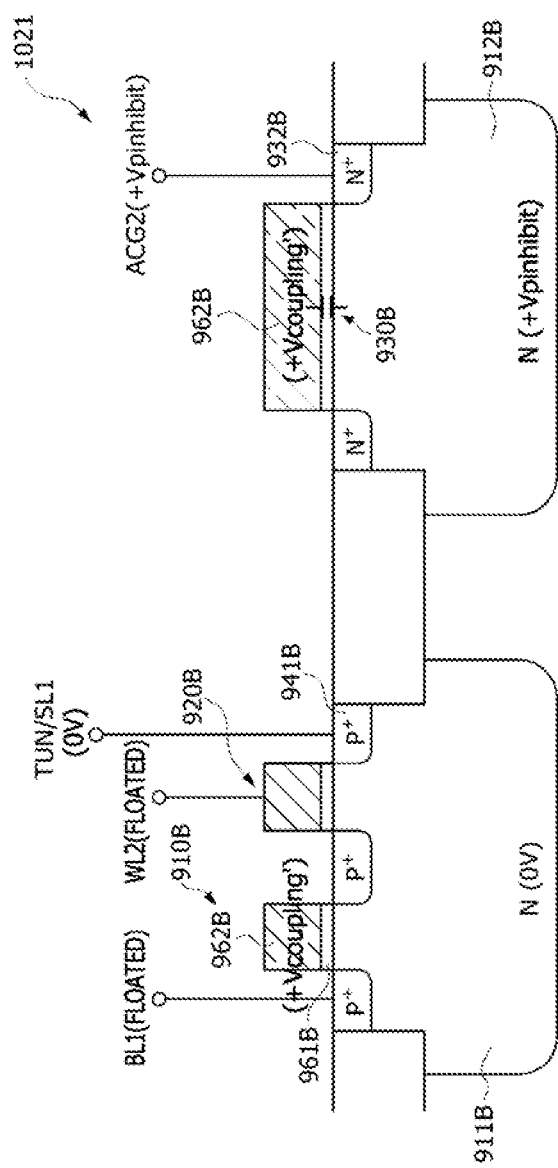
FIG. 13 is a cross-sectional view illustrating a program inhibition operation of a non-selected unit cell sharing a tunnel/source line with a selected unit cell in a single poly nonvolatile memory cell array according to an embodiment.

FIG. 13 is a cross-sectional view illustrating a program inhibition operation of the non-selected unit cell 1021 sharing the first tunnel/source line TUN/SL1 with the selected unit cell 1011 in the single poly NVM cell array 900. Referring to FIG. 13, the positive program inhibition voltage +Vpinhibit applied to the second array control gate line ACG2 of the non-selected unit cell 1021 may be transmitted to a second N-type well region 912B through an N-type contact region 932B. In addition, the ground voltage applied to the first tunnel/source line TUN/SL1 may be transmitted to a first N-type well region 911B.

In such a case, a coupling voltage +Vcoupling may be induced at a floating gate 962B of the non-selected unit cell 1021 by a coupling operation of a capacitive element 930B. Thus, an electric field corresponding to a potential difference between the coupling voltage +Vcoupling and the ground voltage may be created across a gate insulation layer 961B between the floating gate 962B and the first N-type well region 911B. Since the electric field created across the gate insulation layer 961B is insufficient to cause an F-N tunneling phenomenon, a program operation of the non-selected unit cell 1021 may be inhibited.

Figure 14:
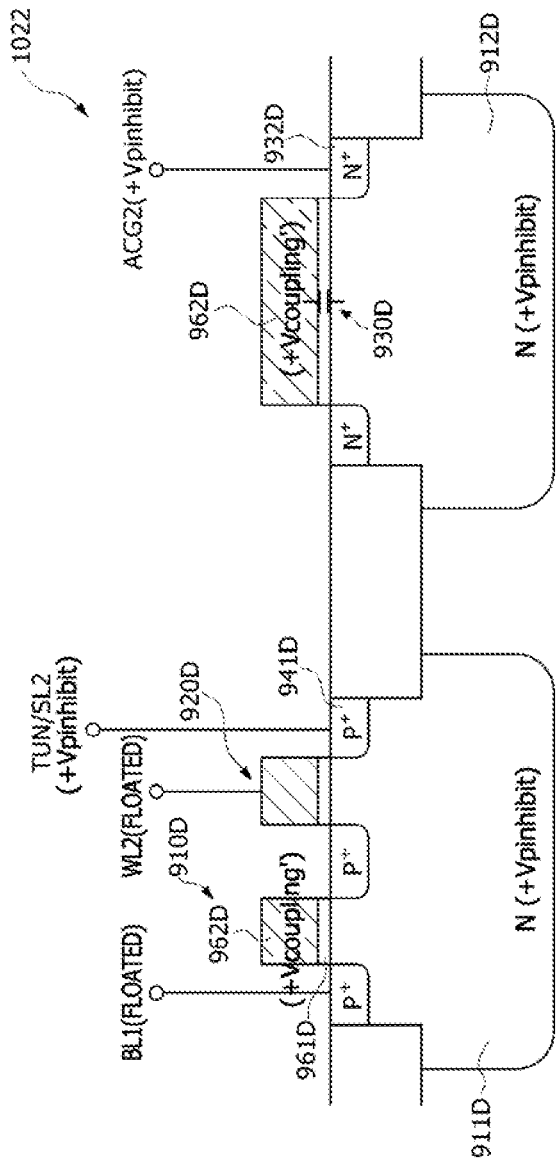
FIG. 14 is a cross-sectional view illustrating a program inhibition operation of a non-selected unit cell that does not share any array control gate line and any tunnel/source line with a selected unit cell in a single poly nonvolatile memory cell array according to an embodiment.

FIG. 14 is a cross-sectional view illustrating a program inhibition operation of the non-selected unit cell 1022 that does not share any array control gate lines and any tunnel/source lines with the selected unit cell 1011 in the single poly NVM cell array 900. Referring to FIG. 14, the positive program inhibition voltage +Vpinhibit applied to the second array control gate line ACG2 of the non-selected unit cell 1022 may be transmitted to a second N-type well region 912D through an N-type contact region 932D. In addition, the positive program inhibition voltage +Vpinhibit applied to the second tunnel/source line TUN/SL2 may be transmitted to a first N-type well region 911D.

In such a case, the same voltage as the positive program inhibition voltage +Vpinhibit may be induced at a floating gate 962D of the non-selected unit cell 1022. Thus, no electric field may be created across a gate insulation layer 961D between the floating gate 962D and the first N-type well region 911D. As a result, a program operation of the non-selected unit cell 1022 may be inhibited.

Figure 15:
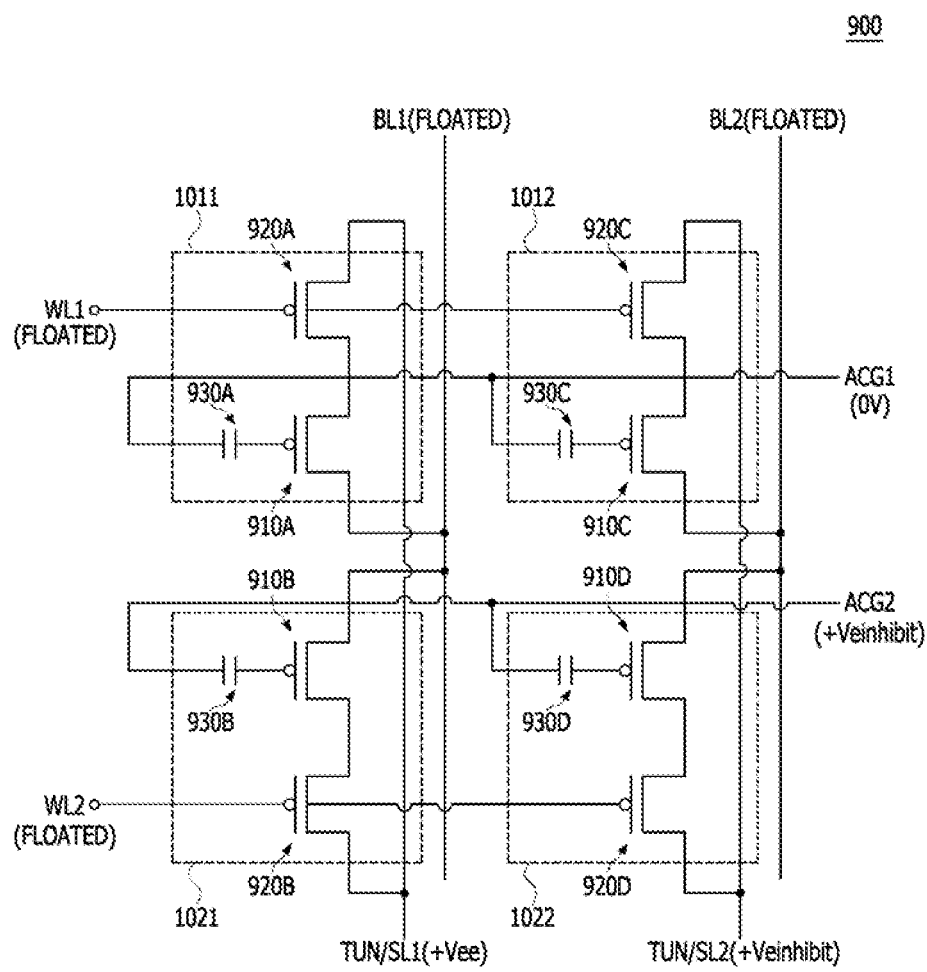
FIG. 15 is an equivalent circuit diagram illustrating an erasure operation of a selected unit cell in a single poly nonvolatile memory cell array according to an embodiment.

FIG. 15 is an equivalent circuit diagram illustrating an erasure operation of the selected unit cell 1011 in the single poly NVM cell array 900 according to an embodiment. In FIG. 15, the same reference designators as used in FIG. 10 denote the same elements. Referring to FIG. 15, to erase the selected unit cell 1011 located at a cross point of the first row and the first column, a ground voltage and a positive erasure voltage +Vee may be applied to the first array control gate line ACG1 and the first tunnel/source line TUN/SL1 coupled to the selected unit cell 1011, respectively. All of the word lines WL1 and WL2 and all of the bit lines BL1 and BL2 are floated. In addition, a positive erasure inhibition voltage +Veinhibit may be applied to the second array control gate line ACG2 coupled to the non-selected unit cells 1021 and 1022 arrayed in the second row and the second tunnel/source line TUN/SL2 coupled to the non-selected unit cells 1012 and 1022 arrayed in the second column.

The positive erasure voltage +Vee may be at a level sufficient for a coupling voltage induced at the floating gate of the selected unit cell 1011 to cause an F-N tunneling phenomenon in the P-channel floating gate transistor 910A of the selected unit cell 1011. In some embodiments, the positive erasure voltage +Vee may be about +20 volts when the unit cells 1011, 1012, 1021 and 1022 are designed to have a cell coupling ratio of about 90% or higher.

The positive erasure inhibition voltage +Veinhibit may be at a level insufficient for coupling voltages induced at the floating gates of the non-selected unit cells 1012, 1021 and 1022 to cause an F-N tunneling phenomenon in the P-channel floating gate transistors 910C, 910B and 910D of the non-selected unit cells 1012, 1021 and 1022. In some embodiments, the positive erasure inhibition voltage +Veinhibit may have a level which is about 50% of the positive erasure voltage +Vee. Under the above erasure bias condition, an erasure operation of the selected unit cell 1011 may be executed by the F-N tunneling mechanism described with reference to FIG. 5.

In some embodiments, all of the unit cells of the single poly nonvolatile memory cell array 900 may be erased in bulk. To execute the bulk erasure operation, a ground voltage and the positive erasure voltage +Vee may be applied to all of the array control gate lines ACG1 and ACG2 and all of the tunnel/source lines TUN/SL1 and TUN/SL2, respectively, while all of the word lines WL1 and WL2 and all of the bit lines BL1 and BL2 are floated. Under the above erasure bias condition, all of the unit cells 1011, 1012, 1021 and 1022 may be simultaneously erased in bulk by the F-N tunneling mechanism described with reference to FIG. 5.

Figure 16:
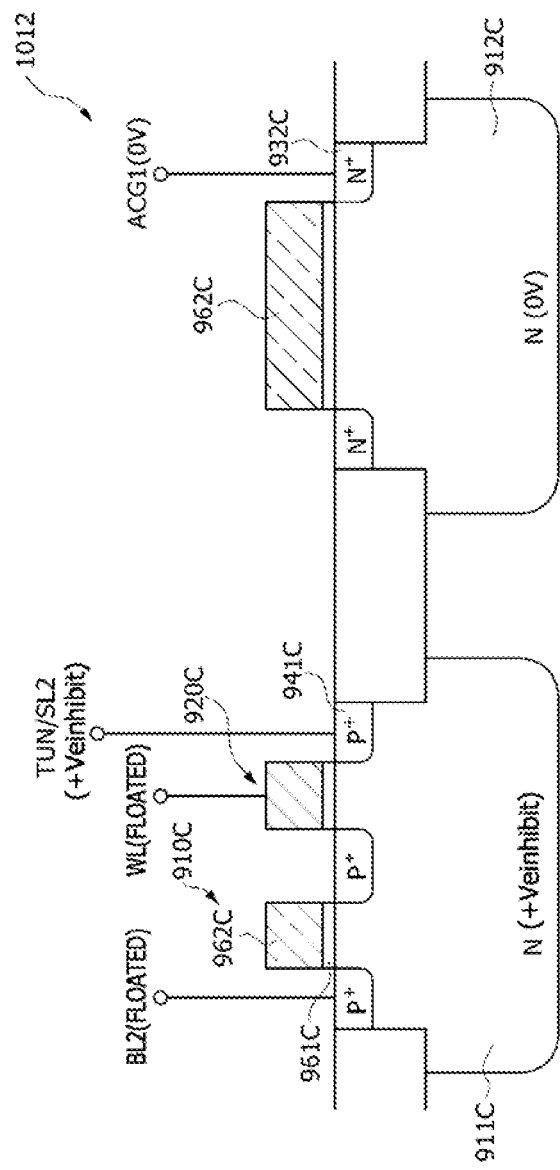
FIG. 16 is a cross-sectional view illustrating an erasure inhibition operation of a non-selected unit cell sharing an array control gate line with a selected unit cell in a single poly nonvolatile memory cell array according to an embodiment.

FIG. 16 is a cross-sectional view illustrating an erasure inhibition operation of the non-selected unit cell 1012 sharing the first array control gate line ACG1 with the selected unit cell 1011 in the single poly NVM cell array 900. Referring to FIG. 16, the ground voltage applied to the first array control gate line ACG1 of the non-selected unit cell 1012 may be transmitted to the second N-type well region 912C through the N-type contact region 932C. In addition, the positive erasure inhibition voltage +Vpinhibit applied to the second tunnel/source line TUN/SL2 may be transmitted to the first N-type well region 911C.

In such a bias condition, a coupling voltage close to the ground voltage may be induced at the floating gate 962C of the non-selected unit cell 1012. Thus, an electric field corresponding to a potential difference between the coupling voltage and the positive erasure inhibition voltage +Veinhibit may be created across the gate insulation layer 961C between the floating gate 962C and the first N-type well region 911C. Since the electric field created across the gate insulation layer 961C is insufficient to cause an F-N tunneling phenomenon, an erasure operation of the non-selected unit cell 1012 may be inhibited.

Figure 17:
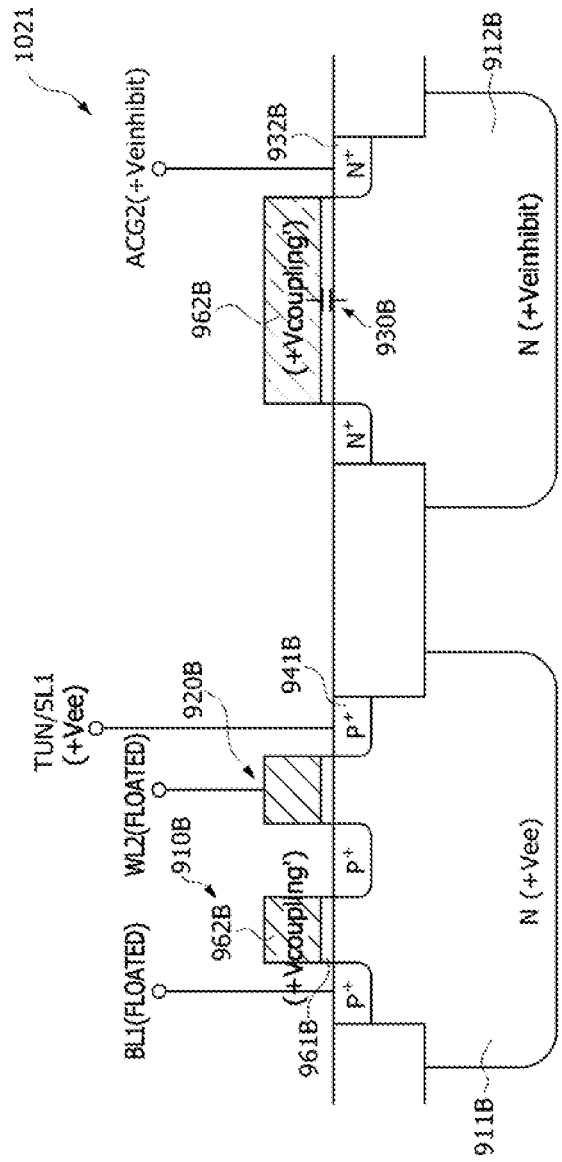
FIG. 17 is a cross-sectional view illustrating an erasure inhibition operation of a non-selected unit cell sharing a tunnel/source line with a selected unit cell in a single poly nonvolatile memory cell array according to an embodiment.

FIG. 17 is a cross-sectional view illustrating an erasure inhibition operation of the non-selected unit cell 1021 sharing the first tunnel/source line TUN/SL1 with the selected unit cell 1011 in the single poly NVM cell array 900. Referring to FIG. 17, the positive erasure inhibition voltage +Veinhibit applied to the second array control gate line ACG2 of the non-selected unit cell 1021 may be transmitted to the second N-type well region 912B through the N-type contact region 932B. In addition, the positive erasure voltage +Vee applied to the first tunnel/source line TUN/SL1 may be transmitted to the first N-type well region 911B.

In such a case, a coupling voltage +Vcoupling may be induced at the floating gate 962B of the non-selected unit cell 1021 by a coupling operation of the capacitive element 930B. Thus, an electric field corresponding to a potential difference between the coupling voltage +Vcoupling and the positive erasure voltage +Vee may be created across the gate insulation layer 961B between the floating gate 962B and the first N-type well region 911B. Since the electric field created across the gate insulation layer 961B is insufficient to cause an F-N tunneling phenomenon, an erasure operation of the non-selected unit cell 1021 may be inhibited.

Figure 18:
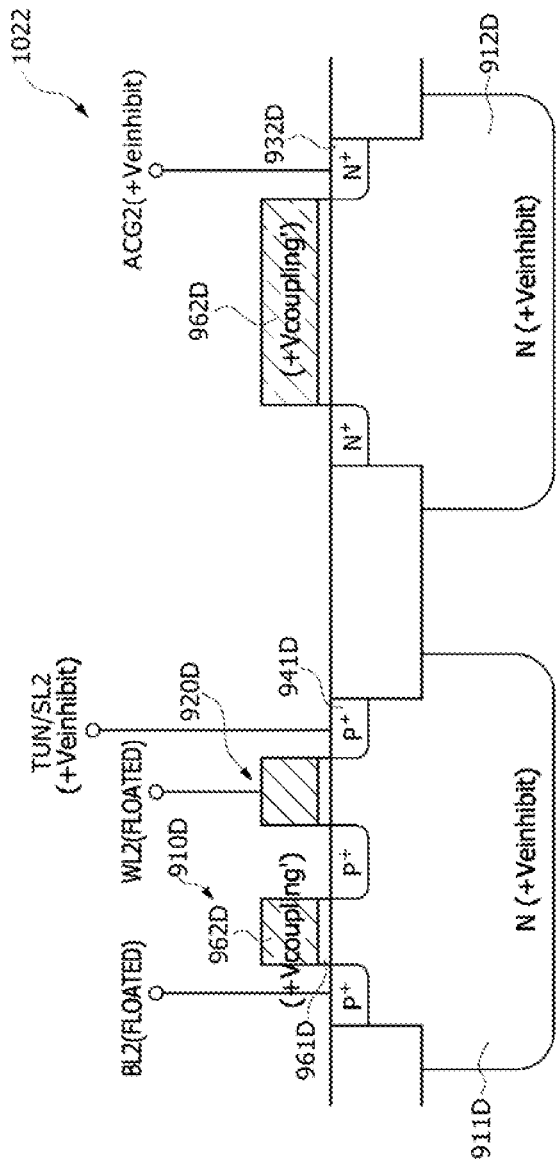
FIG. 18 is a cross-sectional view illustrating an erasure inhibition operation of a non-selected unit cell that does not share any array control gate line and any tunnel/source line with a selected unit cell in a single poly nonvolatile memory cell array according to an embodiment.

FIG. 18 is a cross-sectional view illustrating a erasure inhibition operation of the non-selected unit cell 1022 that does not share any array control gate lines and any tunnel/source lines with the selected unit cell 1011 in the single poly NVM cell array 900. Referring to FIG. 18, the positive erasure inhibition voltage +Veinhibit applied to the second array control gate line ACG2 of the non-selected unit cell 1022 may be transmitted to the second N-type well region 912D through the N-type contact region 932D. In addition, the positive erasure inhibition voltage +Veinhibit applied to the second tunnel/source line TUN/SL2 may be transmitted to the first N-type well region 911D. In such a case, the same voltage as the positive erasure inhibition voltage +Veinhibit may be induced at the floating gate 962D of the non-selected unit cell 1022. Thus, no electric field may be created across the gate insulation layer 961D between the floating gate 962D and the first N-type well region 911D. As a result, an erasure operation of the non-selected unit cell 1022 may be inhibited.

Figure 19:
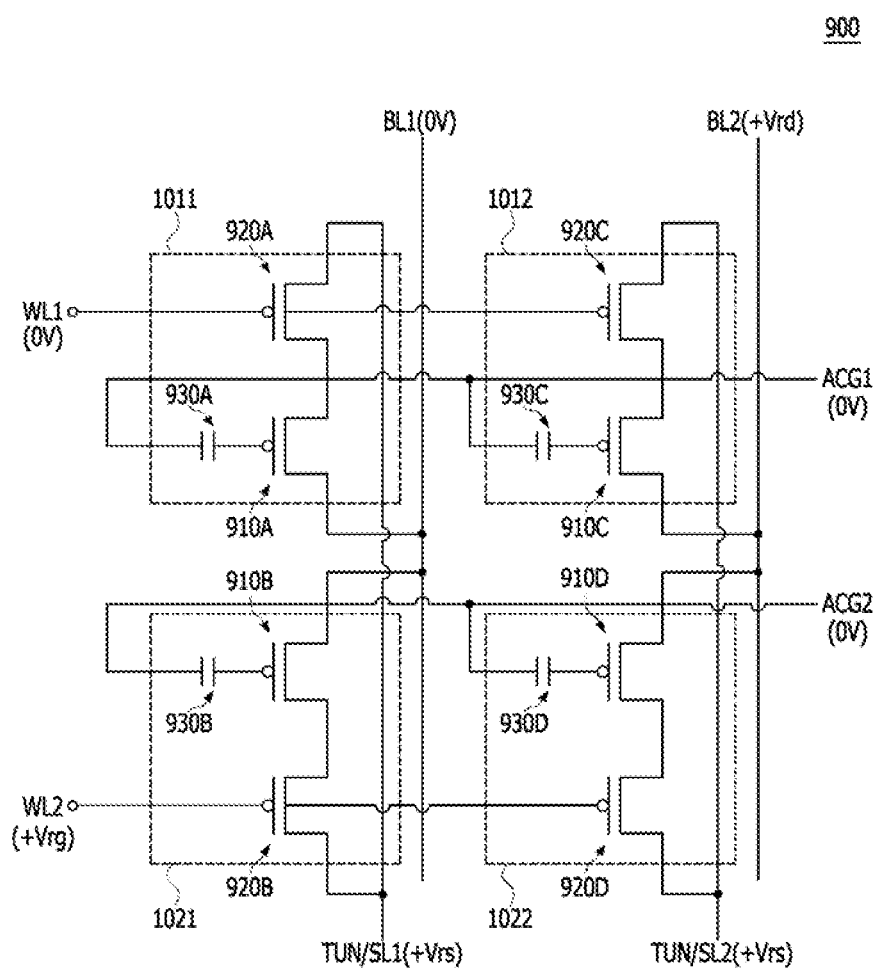
FIG. 19 is an equivalent circuit diagram illustrating a read operation of a selected unit cell in a single poly nonvolatile memory cell array according to an embodiment.

FIG. 19 is an equivalent circuit diagram illustrating a read operation of the selected unit cell 1011 in the single poly NVM cell array 900 according to an embodiment. In FIG. 19, the same designators as used in FIG. 10 denote the same elements. Referring to FIG. 19, to read the selected unit cell 1011 located at a cross point of the first row and the first column, a ground voltage may be applied to the first word line WL1, the first bit line BL1 and the first array control gate line ACG1 coupled to the selected unit cell 1011. In addition, a positive read source voltage +Vrs may be applied to all of the tunnel/source lines TUN/SL1 and TUN/SL2, and a positive read gate voltage +Vrg may be applied to the second word line WL2 which is not coupled to the selected unit cell 1011. Moreover, a positive read drain voltage +Vrd may be applied to the second bit line BL2 which is not coupled to the selected unit cell 1011, and a ground voltage may be applied to the second array control gate line ACG2 which is not coupled to the selected unit cell 1011.

The positive read gate voltage +Vrg may have a level which is capable of turning off the P-channel read selection transistors 920B and 920D of the non-selected unit cells 1021 and 1022. In some embodiments, the positive read gate voltage +Vrg may be about +5 volts.

The positive read source voltage +Vrs may have substantially the same level as the positive read drain voltage +Vrd. In some embodiments, the positive read source voltage +Vrs and the positive read drain voltage +Vrd may have substantially the same level as the positive read gate voltage +Vrg. Under the above read bias condition, the selected unit cell 1011 may be selectively read out by the same read operation as described with reference to FIG. 6.

While the read operation of the selected unit cell 1011 is executed, a current flowing through the first bit line BL1 and the first tunnel/source line TUN/SL1 may not be affected by the non-selected unit cell 1021 sharing the first bit line BL1 and the first tunnel/source line TUN/SL1 with the selected unit cell 1011 since the read selection transistor 920B of the non-selected unit cell 1021 is turned off.

As described above, a single poly NVM cell array according to an embodiment may execute a selective program operation as well as a selective erasure operation to a specific unit cell by controlling biases applied to array control gate lines and tunnel/source lines. Thus, during the program operation and the erasure operation, an array control gate line decoder and a tunnel/source line decoder may operate without operation of a word line driver. That is, during the program operation and the erasure operation, the word lines and bit lines may remain floated.

The word line driver may operate only during a read operation. In addition, the program operation, the erasure operation and the read operation may be executed by applying a ground voltage or a positive voltage to the array control gate lines, the tunnel/source lines, the bit lines and the word lines. That is, no negative voltage may be applied to the array control gate lines, the tunnel/source lines, the bit lines and the word lines during the program operation, the erasure operation and the read operation. Accordingly, no negative charge pump circuits may be required.

According to various embodiments of the present disclosure, no negative bias voltage may be used in the program operation, the erasure operation and the read operation. Thus, a negative charge pump circuit for generating the negative bias voltage may not be required to operate a single poly NVM cell. Moreover, the program operation and the erasure operation may be executed by applying biases only to the array control gate lines and the tunnel/source lines. Accordingly, a decoding circuit that is, a decoder for the program operation and the erasure operation may be simplified.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A single poly nonvolatile memory (NVM) cell comprising:
   a first N-type well region and a second N-type well region spaced apart from each other by a P-type semiconductor layer;
   a first active region and a second active region disposed in the first N-type well region and the second N-type well region, respectively;
   a P-channel floating gate transistor including a floating gate disposed in the first active region, a P-type drain region disposed in the first active region, and a P-type junction region disposed in the first active region, wherein the floating gate extends to over the second active region;
   a P-channel read selection transistor including a read selection gate electrode disposed in the first active region, the P-type junction region disposed in the first active region, and a P-type source region disposed in the first active region;
   an interconnection line connecting the first N-type well region to the P-type source region of the P-channel read selection transistor; and
   a second N-type contact region disposed in the second active region,
   wherein the second N-type contact region has a rectangular loop shape to surround the floating gate in the second active region.

2. The single poly NVM cell of claim 1, wherein the P-channel floating gate transistor and the P-channel read selection transistor share the P-type junction region with each other.

3. The single poly NVM cell of claim 1, further comprising:
   a third active region disposed in the first N-type well region and spaced apart from the first active region; and a first N-type contact region disposed in the third active region,
wherein the interconnection line connects the first N-type contact region to the P-type source region.

4. The single poly NVM cell of claim 1, further comprising:
a word line coupled to the read selection gate electrode;
an array control gate line coupled to the second N-type contact region;
a tunnel/source line coupled to the P-type source region of the read selection transistor and the first N-type contact region through the interconnection line; and
a bit line coupled to the P-type drain region of the P-channel floating gate transistor.

5. The single poly NVM cell of claim 1,
wherein the read selection gate electrode is disposed within the first N-type well region and does not extend outside of the first N-type well region.

6. The single poly NVM cell of claim 1,
wherein the first N-type well region and the second N-type well region are spaced apart from each other in a first direction; and
wherein the first active region extends in the first direction and has a stripe shape.

7. The single poly NVM cell of claim 1,
wherein the first N-type well region and the second N-type well region are spaced apart from each other in a first direction; and
wherein the first active region extends in a second direction intersecting the first direction and has a stripe shape.

* * * * *